(12) United States Patent
Hsueh et al.

(10) Patent No.: US 11,004,685 B2
(45) Date of Patent: May 11, 2021

(54) MULTI-LAYER STRUCTURES AND METHODS OF FORMING

(71) Applicant: Taiwan Semiconductor Manufacturing Company, Ltd., Hsinchu (TW)

(72) Inventors: Chang-Jung Hsueh, Taipei (TW); Chen-En Yen, Changhua County (TW); Chin Wei Kang, Tainan (TW); Kai Jun Zhan, Taoyuan (TW); Wei-Hung Lin, Xinfeng Township (TW); Cheng Jen Lin, Kaohsiung (TW); Ming-Da Cheng, Jhubei (TW); Ching-Hui Chen, Hsinchu (TW); Mirng-Ji Lii, Sinpu Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/694,121

(22) Filed: Nov. 25, 2019

(65) Prior Publication Data
US 2020/0176254 A1 Jun. 4, 2020

Related U.S. Application Data

(60) Provisional application No. 62/773,559, filed on Nov. 30, 2018.

(51) Int. Cl.
*H01L 21/311* (2006.01)
*H01L 21/033* (2006.01)
(Continued)

(52) U.S. Cl.
CPC ...... *H01L 21/0337* (2013.01); *H01L 21/0273* (2013.01); *H01L 21/0332* (2013.01);
(Continued)

(58) Field of Classification Search
CPC ........... H01L 21/0337; H01L 21/31144; H01L 21/31058; H01L 21/0332; H01L 21/31116;
(Continued)

(56) References Cited

U.S. PATENT DOCUMENTS 5,554,488 A * 9/1996 Rioux .................... G03F 7/092
216/47
6,387,820 B1 * 5/2002 Sanderfer ......... H01L 21/31116
257/E21.252

(Continued)

*Primary Examiner* — Errol V Fernandes
*Assistant Examiner* — Jeremy J Joy
(74) *Attorney, Agent, or Firm* — Slater Matsil, LLP

(57) ABSTRACT

A method includes depositing a plurality of layers on a substrate, patterning a first mask overlying the plurality of layers, and performing a first etching process on the plurality of layers using the first mask. The method also includes forming a polymer material along sidewalls of the first mask and sidewalls of the plurality of layers, and removing the polymer material. The method also includes performing a second etching process on the plurality of layers using the remaining first mask, where after the second etching process terminates a combined sidewall profile of the plurality of layers comprises a first portion and a second portion, and a first angle of the first portion and a second angle of the second portion are different to each other.

20 Claims, 25 Drawing Sheets

(51) Int. Cl.
*H01L 21/3105* (2006.01)
*H01L 21/3213* (2006.01)
*H01L 21/027* (2006.01)
*H01L 21/8238* (2006.01)
*H01L 27/092* (2006.01)

(52) U.S. Cl.
CPC .. *H01L 21/31058* (2013.01); *H01L 21/31116* (2013.01); *H01L 21/31144* (2013.01); *H01L 21/32135* (2013.01); *H01L 21/32139* (2013.01)

(58) Field of Classification Search
CPC ....... H01L 21/32139; H01L 21/823871; H01L 21/823857; H01L 21/823828; H01L 21/8238; H01L 21/0271; H01L 21/0272; H01L 21/32135–21/32137; H01L 27/092
See application file for complete search history.

(56) References Cited

U.S. PATENT DOCUMENTS

| | | | |
|---|---|---|---|
| 8,071,485 B2* | 12/2011 | Lee | H01L 21/0337 438/717 |
| 10,038,137 B2* | 7/2018 | Chuang | H01L 43/02 |
| 2005/0095783 A1* | 5/2005 | Haselden | H01L 21/32137 438/257 |
| 2008/0190886 A1* | 8/2008 | Choi | C23C 16/345 216/23 |
| 2011/0316096 A1* | 12/2011 | Wei | H01L 21/28123 257/413 |
| 2015/0311218 A1* | 10/2015 | Hsu | H01L 29/40114 257/316 |
| 2018/0204902 A1* | 7/2018 | Huang | H01L 27/222 |
| 2019/0006455 A1* | 1/2019 | Ku | H01L 24/13 |
| 2019/0362983 A1* | 11/2019 | Shimizu | H01J 37/3244 |

* cited by examiner

MULTI-LAYER STRUCTURES AND METHODS OF FORMING

PRIORITY CLAIM AND CROSS-REFERENCE

This application claims the benefit of U.S. Provisional Application No. 62/773,559, filed on Nov. 30, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
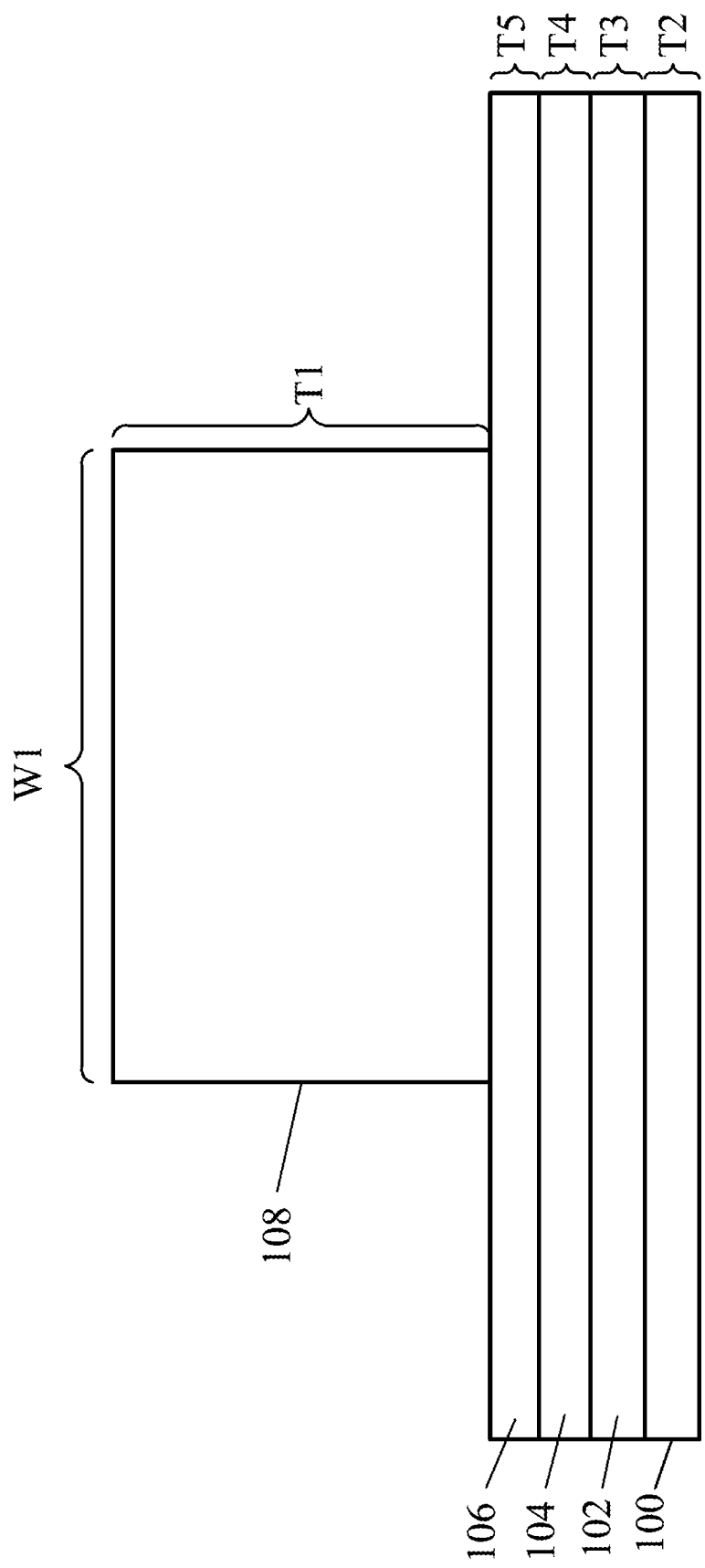
FIGS. 1-25 are cross-sectional views of intermediate steps in the formation of various devices in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multi-layer structures, and methods of forming multi-layer structures, are provided in accordance with some embodiments. The multi-layer structures may have sidewalls having profiles that may be tailored to a particular design. For example, in a multi-layered structure, one layer of the multi-layered structure may have a sidewall that extends at a first angle, a second layer of the multi-layered structure may have a sidewall that extends at a second angle, and the first and second angle may be different from each other. The multi-layer structure may also include additional layers, and sidewalls of the additional layers may extend at angles that are the same as the first angle or the second angle, or different from the first angle or the second angle. In this manner, a desired sidewall profile of the multi-layer structure may be achieved.

In accordance with some embodiments, a desired sidewall profile of a multi-layer structure may be achieved with only one deposition/lithography/etching process, instead of using multiple deposition/lithography/etching processes. Accordingly, a multi-layer structure having a desired sidewall profile may be formed at a lower cost and with less time. Manufacturing cycle times and/or outputs may be improved.

In accordance with some embodiments, a multi-layer structure having a sidewall profile as described herein may be utilized in the formation of integrated Silicon-nanosystem (Si-nanosystem) devices that contain sandwich architectures extending beside and/or overlying multi-layer structures. In some embodiments the multi-layer structures overlie a silicon-complementary metal oxide semiconductor (CMOS) chip. Some Si-nanosystem devices may include a multi-layer structure over the CMOS chip. One or more layers may overlie the multi-layer structure, and these layers may extend laterally beyond the multi-layer structure over the CMOS chip. In some devices, it may be desirable to form a first layer of the one or more layers in a manner that a first portion of the first layer that does not overlie the multi-layer structure is discontinuous with a second portion of the first layer that overlies the multi-layer structure. Similarly, in some devices it may be desirable to form a second layer in a manner that a first portion of the second layer that contacts the first portion of the first layer is discontinuous from a second portion of the second layer that overlies the second portion of the first layer. Other layers may be desired to be continuous between portions of the layers that overlie the multi-layer structure and portions that do not overlie the multi-layer structure. The sidewall profile of the multi-layer structure may be designed in a matter that at least a portion of the sidewall helps to confine and/or cut off the first portion of the first layer from the second portion of the first layer, and/or the first portion of the second layer from the second portion of the second layer, while allowing other layers to be formed to be continuous.

Referring to FIG. 1, a substrate 100 is provided. Any suitable substrate may be used. In some embodiments, substrate 100 may include an integrated circuit that includes one or more active devices, passive devices, and electrical circuits, and one or more layers may be formed over the integrated circuit. For example, substrate 100 may include a complementary metal-oxide-semiconductor (CMOS) chip. Substrate 100 may also include one or more dielectric layers formed over the CMOS chip. In some embodiments, substrate 100 may include any number of silicon layers, metal layers, conductive layers, semiconductive layers, or the like.

In some embodiments, substrate 100 may be free of active devices, and may include only passive devices or electrical connectors. In other embodiments, substrate 100 may be free of any active devices, passive devices, or electrical connectors. Any suitable materials may be used to form substrate 100. In some embodiments, substrate 100 may have a thickness T2 of about 50 Å to about 700,000 Å.

A first layer 102 is formed over substrate 100. In some embodiments, first layer 102 may be a monolithic or heterogeneous thin film. In some embodiments, first layer 102 may be a metal or a metal-containing material. For example, first layer 102 may include titanium (Ti), copper (Cu), nickel (Ni), chromium (Cr), and/or aluminum (Al). In some embodiments, first layer 102 may include a combination of metal materials, such as aluminum copper (AlCu). In other embodiments, first layer 102 may include a dielectric material. For example, first layer 102 may include a silicon-based dielectric material, such as silicon oxide or silicon nitride.

A material composition of first layer 102 may be selected according to an etch rate of the material composition in a etching process, by itself and/or as compared to the material composition of second layer 104 and third layer 106 (discussed below). For example, the material compositions of each layer, by themselves and/or as compared to other layers, may be selected according to the etch rate of each layer in a particular etching process and a desired sidewall profile of a multi-layer structure being formed.

First layer 102 may be deposited, for example using chemical vapor deposition (CVD), atomic layer deposition (ALD), physical vapor deposition (PVD), plasma enhanced CVD (PECVD), or the like. First layer 102 may have a thickness T3 of about 50 Å to about 5000 Å.

A second layer 104 is formed over first layer 102. In some embodiments, second layer 104 may be a monolithic or heterogeneous thin film. Second layer 104 may be formed of the same material as first layer 102, or may be formed of a different material than first layer 102. For example, second layer 104 may include Ti, Cu, Ni, Cr, and/or Al. In some embodiments, second layer 104 may include a combination of metal materials, such as AlCu. In other embodiments, second layer 104 may include a dielectric material. For example, second layer 104 may include a silicon-based dielectric material, such as silicon oxide or silicon nitride. When first layer 102 is composed of a metal or a metal-containing material, second layer 104 may also be composed of a metal or metal-containing material. Similarly, when first layer 102 is composed of a dielectric material, second layer 104 may also be composed of a dielectric material.

As discussed above in connection with first layer 102, a material composition of second layer 104 may be selected according to an etch rate of the material composition in a etching process, by itself and/or as compared to the material composition of first layer 102 and third layer 106 (discussed below). For example, the material compositions of each layer, by themselves and compared to other layers, may be selected according to the etch rate of each layer in a particular etching process and a desired sidewall profile of a multi-layer structure being formed.

Second layer 104 may be deposited using the same or similar methods as described above in connection with first layer 102. For example, second layer 104 may be deposited using CVD, ALD, PVD, PECVD, or the like. Second layer 104 may have a thickness T4 of about 50 Å to about 50000 Å.

A third layer 106 is formed over second layer 104. In some embodiments, third layer 106 may be a monolithic or heterogeneous thin film. Third layer 106 may be formed of the same material as first layer 102 and/or second layer 104, or may be formed of a different material than first layer 102 and/or second layer 104. For example, third layer 106 may include Ti, Cu, Ni, Cr, and/or Al. In some embodiments, third layer 106 may include a combination of metal materials, such as AlCu. In other embodiments, third layer 106 may include a dielectric material. For example, third layer 106 may include a silicon-based dielectric material, such as silicon oxide or silicon nitride. When first layer 102 is composed of a metal or a metal-containing material and second layer 104 is composed of a metal or a metal-containing material, third layer 106 may also be composed of a metal or metal-containing material. Similarly, when first layer 102 and second layer 104 are composed of dielectric material(s), third layer 106 may also be composed of a dielectric material.

As discussed above in connection with first layer 102 and second layer 104, a material composition of third layer 106 may be selected according to an etch rate of the material composition in a etching process, by itself and/or as compared to the material composition of first layer 102 and second layer 104 (discussed below). For example, the material compositions of each layer, by themselves and compared to other layers, may be selected according to the etch rate of each layer in a particular etching process and a desired sidewall profile of a multi-layer structure being formed.

Third layer 106 may be deposited using the same or similar methods as described above in connection with first layer 102 and second layer 104. For example, third layer 106 may be deposited using CVD, ALD, PVD, PECVD, or the like. Third layer 106 may have a thickness T5 of about 50 Å to about 5000 Å.

A photoresist 108 is formed over third layer 106, for example using a spin coating process. Photoresist 108 may be a positive photoresist or a negative photoresist, and may be a single-layer or a tri-layer photoresist. Photoresist 108 is patterned to form the patterned photoresist 108 shown in FIG. 1. In some embodiments, photoresist 108 is patterned using one or more lithography and/or etching steps. As shown in FIG. 1, after photoresist 108 is patterned, first layer 102, second layer 104, and third layer 106 each extend laterally beyond sidewalls of patterned photoresist 108. Patterned photoresist 108 may have a thickness T1 of about 5000 Å to about 20000 Å. Patterned photoresist 108 may have a width W1 of about 2000 Å to about 50000 Å.

Next, a first etching process is performed using patterned photoresist 108 as an etching mask. The first etching process may be a dry etching process. In some embodiments, for example when the first layer 102, the second layer 104, and the third layer 106 are formed of one or more dielectric materials, the first etching process may use carbon and fluorine as etchants, and may also use oxygen gas or an oxygen gas mixture in some embodiments. In some embodiments, for example when the first layer 102, the second layer 104, and the third layer 106 are formed of one or more metal materials, the first etching process may also use carbon and fluorine as etchants. For example, when the first layer 102, the second layer 104, and the third layer 106 are formed of one or more metal materials, the first etching process may use $CF_4$ and $O_2$ as etching materials. In some embodiments, the first etching process may use $CF_4$, $CHF_3$, $C_2F_2$, $BCl_3$, HBr, $CH_4$, or the like as an etchant(s). The etchants selected for the first etching process may be selected on the basis of the material compositions of first layer 102, second layer 104, and/or third layer 106, and according to a desired sidewall profile of first layer 102, second layer 104, and third layer 106 after the first etching process. Portions of first layer 102, second layer 104, and third layer 106 that do not underlie the patterned photoresist 108 may be removed during the first etching process. In some embodiments, the first etching process may have an etching duration of about 25 seconds to 250 seconds, and an etching temperature of about 10° C. to about 100° C. In some embodiments, the first etching process may occur at an etching pressure of about 10 mTorr-300 mTorr.

Figure 2:
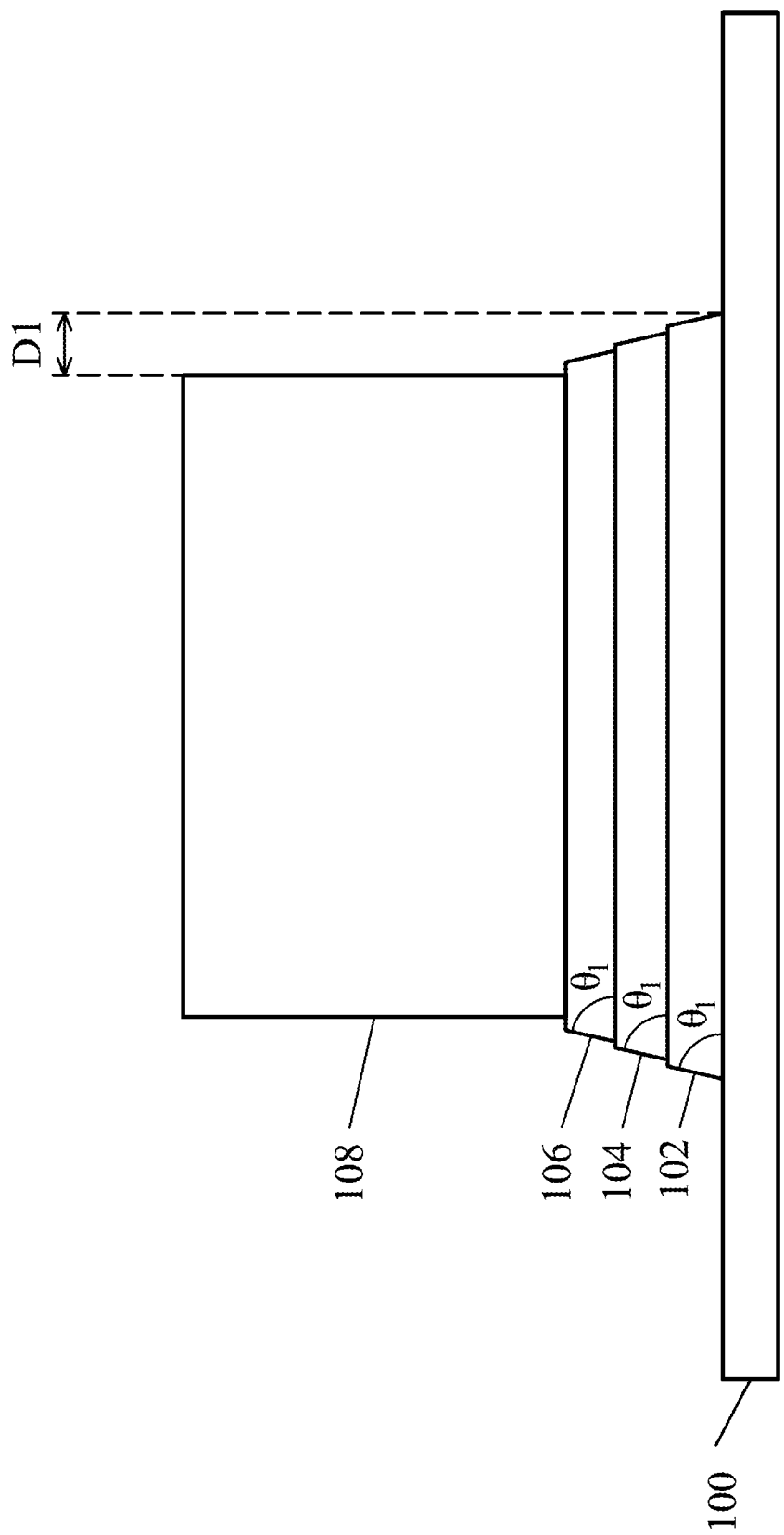

As shown in FIG. 2, after the first etching process, the multi-level structure formed by first layer 102, second layer 104, and third layer 106 may have sidewalls that are tapered. For example, sidewalls of first layer 102, second layer 104, and/or third layer 106 may extend at an angle θ1 with respect to a major surface of substrate 100. In some embodiments, angle θ1 may be about 30° to about 90°. An angle of a sidewall of first layer 102 may extend at a same angle with respect to the major surface of substrate 100 as an angle of a sidewall of second layer 104, or the angle of the sidewall of first layer 102 may extend at a different angle than the sidewall of second layer 104 (for example due to materials compositions of first layer 102 and second layer 104 having different etch rates with respect to the first etching process). Similarly, the angle of first layer 102 may extend at a same angle with respect to the major surface of substrate 100 as an angle of a sidewall of third layer 106, or the angle of the sidewall of first layer 102 may extend at a different angle than the sidewall of third layer 106 (for example due to materials compositions of first layer 102 and third layer 106 having different etch rates with respect to the first etching process). Further, the angle of the sidewall of second layer 104 may extend at a same angle with respect to the major surface of substrate 100 as an angle of a sidewall of third layer 106, or the angle of the sidewall of second layer 104 may extend at a different angle than the sidewall of third layer 106 (for example due to materials compositions of third layer 106 and second layer 104 having different etch rates with respect to the first etching process). As shown in FIG. 2, after the first etching process terminates the edges of first layer 102, second layer 104, and/or third layer 106 may extend laterally beyond the edges of patterned photoresist 108. For example, first layer 102 may extend a distance D1 beyond one or more edges of patterned photoresist 108. In some embodiments, D1 is about 50 Å to about 1500 Å.

Figure 3:
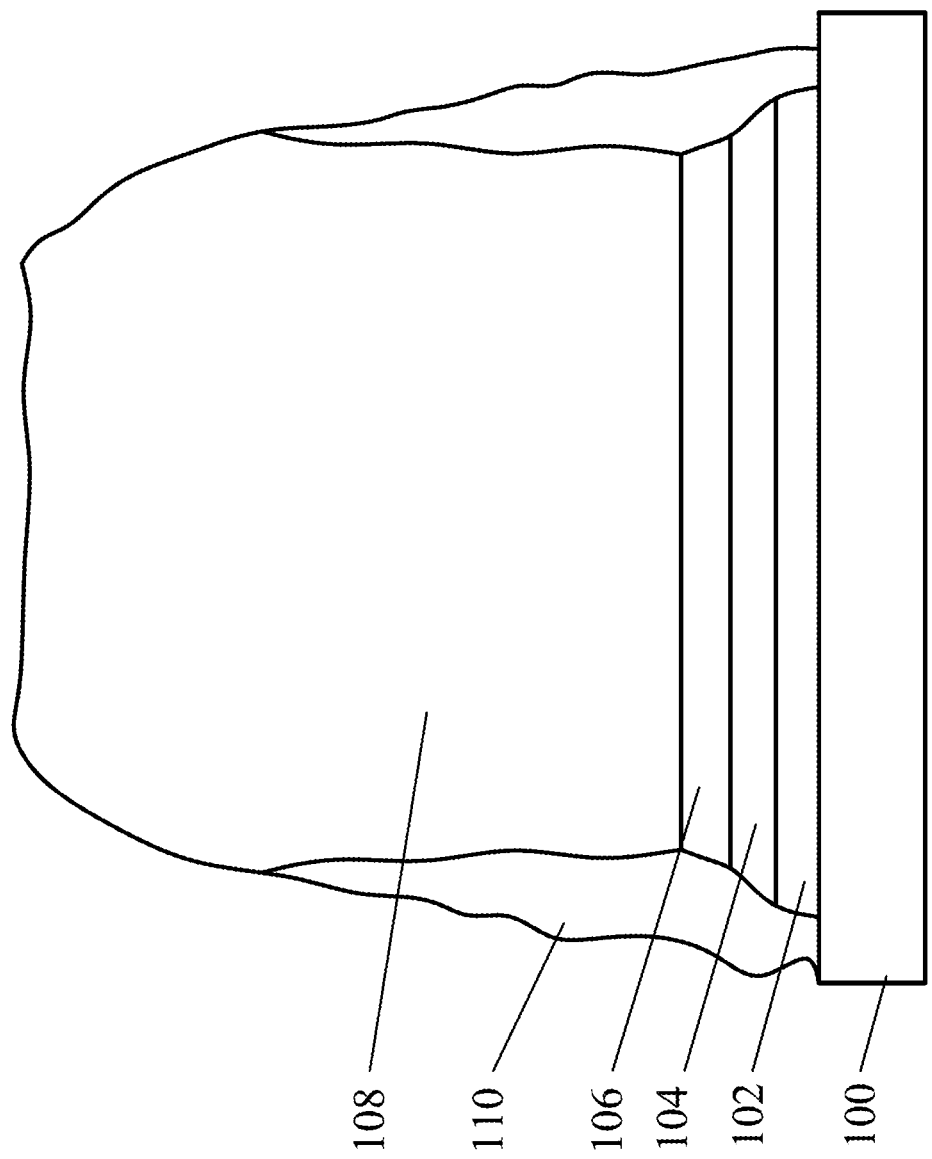

Next, referring to FIG. 3, a polymer 110 is formed along edges of patterned photoresist 108 and along sidewalls of first layer 102, second layer 104, and third layer 106. In some embodiments, polymer 110 is deposited. For example, in some embodiments polymer-forming gases may be used during the polymer deposition step, to coat the multilayer structure sidewalls and assist in etch profile control. Although FIG. 3 depicts polymer 110 being formed solely along the sidewalls of patterned photoresist 108 and along sidewalls of first layer 102, second layer 104, and third layer 106, in some embodiments polymer 110 may also extend over the patterned photoresist 108. In some embodiments, the polymer-forming gases include $CHF_3$, $CH_2F_2$, $CF_4$, $C_2F_6$, and $C_4F_8$, or the like. During the forming of polymer 110, a plasma source gas is fed into a process chamber, with a flow rate of the plasma source gas being dependent on the process chamber design. In some embodiments, a feeding rate of the plasma source gas and/or the deposition time may be optimized to selectively control polymer 110 to be formed along the edges of patterned photoresist 108 and along the sidewalls of first layer 102, second layer 104, and third layer 106, according to a desired design. A thickness of polymer 110 may be thinnest at a top portion of polymer 110 and thicker at a bottom portion of polymer 110, and a thickness of polymer 110 may vary according to height. The bottom portion of polymer 110 may contact substrate 100.

Figure 4:
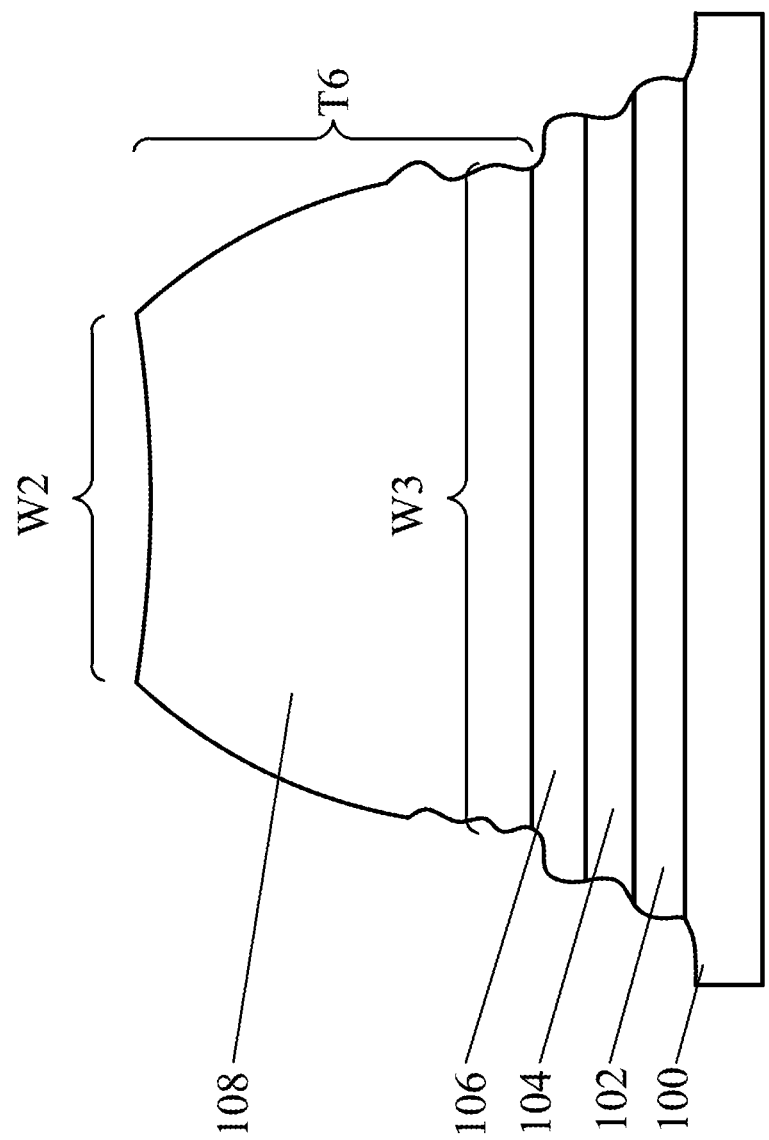

Referring to FIG. 4, the polymer 110 is removed. In some embodiments, polymer 110 may be removed using an $O_2$ ashing process. The $O_2$ ashing process may consume a portion of the patterned photoresist 108. For example, a thickness of the patterned photoresist 108 may be reduced by the $O_2$ ashing process. In some embodiments, after the $O_2$ ashing process the patterned photoresist 108 may have a thickness T6. Thickness T6 may be about 1500 Å to about 15000 Å. After the $O_2$ ashing process, the patterned photoresist 108 may have a top surface that is concave. In other embodiments, the patterned photoresist 108 may have a top surface that is planar after the $O_2$ ashing process. After the $O_2$ ashing process, patterned photoresist 108 may have tapered sidewalls. For example, a width of the patterned photoresist 108 may vary according to height. A width W2 of the top surface of patterned photoresist 108 after the $O_2$ ashing process may be about 2000 Å to about 15000 Å. A width W3 of the bottom surface of patterned photoresist 108 after the $O_2$ ashing process may be about 3000 Å to about 20000 Å. A top surface of third layer 106 may be exposed by the consuming of the patterned photoresist 108 by the $O_2$ mixture in the ashing process. In some embodiments, a portion of one or more of first layer 102, second layer 104, and/or third layer 106 may be consumed by the $O_2$ ashing process.

Figure 5:
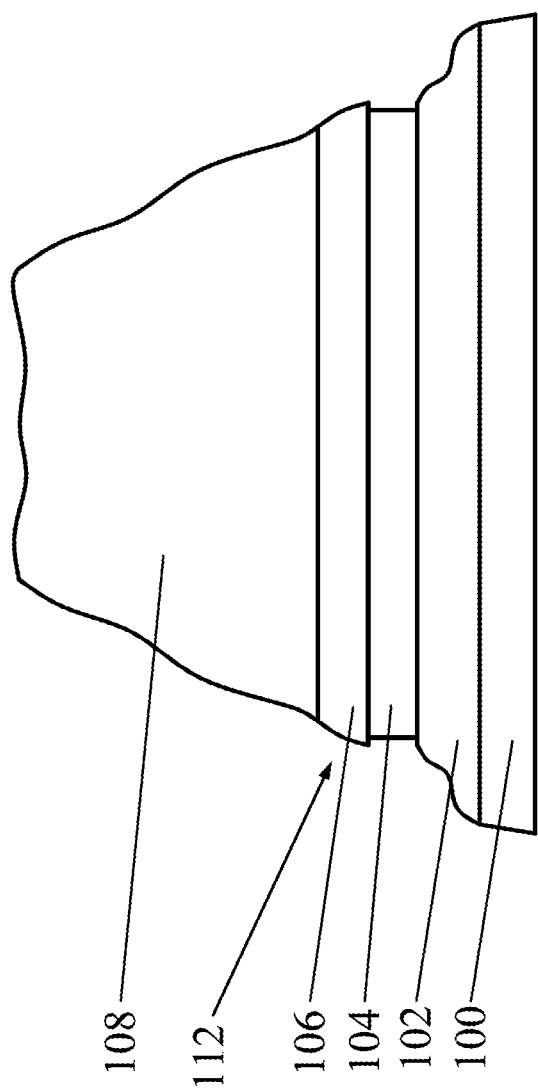

Next, referring to FIG. 5, a second etching process is performed using the patterned photoresist 108 as an etch mask. The second etching process may be a dry etching process in some embodiments. In some embodiments, an etching material may be selected according to a desired sidewall profile of first layer 102, second layer 104, and third layer 106, and according to a material composition of first layer 102, second layer 104, and third layer 106. The etching material may comprise the same or similar materials as is used in the first etching process described above. For example, $CHF_3$, $CH_2F_2$, $CF_4$, $C_2F_6$, and $C_4F_8$ along with an $O_2$ mixture may be used as etchants in some embodiments, for example when first layer 102, second layer 104, and third layer 106 are formed of one or more dielectric materials. The etching material may comprise $CF_4$ and $O_2$ in some embodiments, for example when first layer 102, second layer 104, and third layer 106 are formed of one or more metal materials. In some embodiments, the second etching process may have an etching duration of about 25 seconds to 250 seconds, and an etching temperature of about 10° C. to about 100° C. In some embodiments, the second etching process may occur at an etching pressure of about 10 mTorr-300 mTorr. The etching parameters of the second etching process may be the same as, or different to, the etching parameters of the first etching process.

The second etching process may continue until a desired profile of combined sidewalls of first layer 102, second layer 104, and third layer 106 are achieved. For example, FIG. 5 depicts a particular sidewall profile of a multilayer structure 112 formed by first layer 102, second layer 104, and third layer 106. When the desired sidewall profile of multilayer structure 112 is achieved, the second etching process may terminate. In some embodiments, the achieving of the desired sidewall profile may be determined according to an elapsed time of the second etching process. In some embodiments, the achieving of the desired sidewall profile may be determined using measurement.

Figure 6:
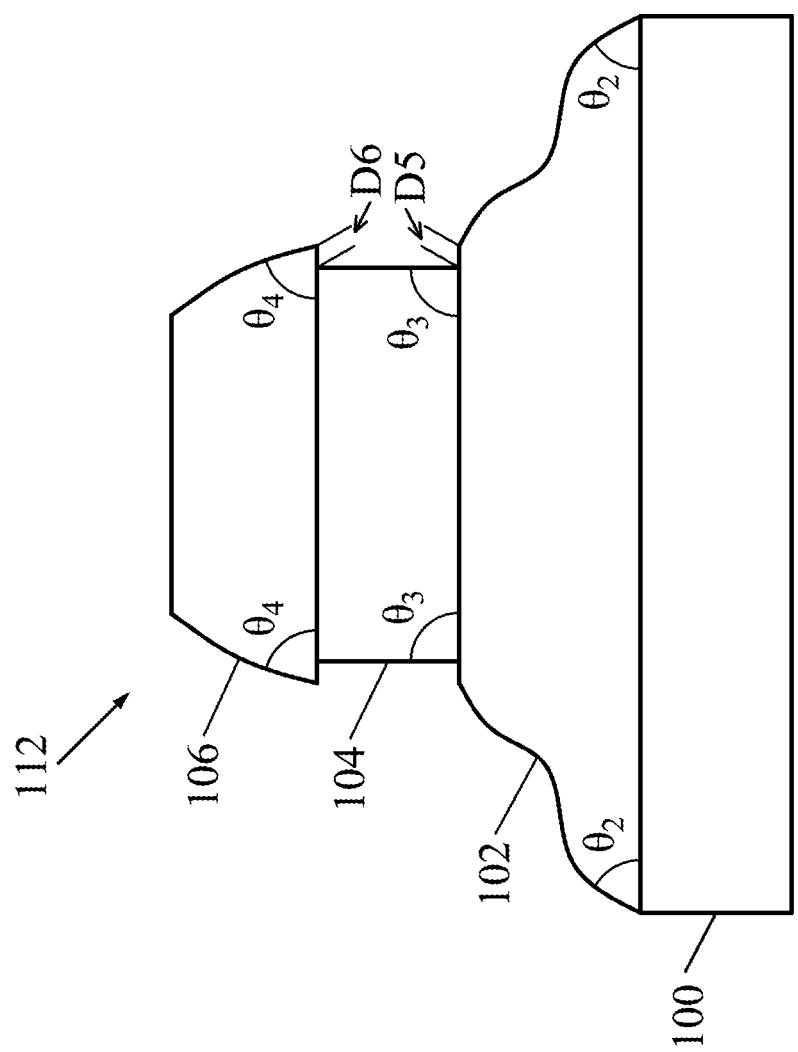

Next, the patterned photoresist 108 is removed, for example using an ashing process. The resulting structure is shown in FIG. 6. A multilayer structure 112, as depicted in FIG. 6, includes first layer 102, second layer 104, and third layer 106. Each of first layer 102, second layer 104, and third layer 106 has respective sidewalls that form respective angles with respect to a major surface of substrate 100. For example, sidewalls of first layer 102 have a footing angle $\theta_2$ with respect to the major surface of substrate 100. In some embodiments, footing angle $\theta_2$ is about 55° to about 90°. Sidewalls of second layer 104 have a re-entrant angle $\theta_3$ with respect to the major surface of substrate 100. In some embodiments, re-entrant angle $\theta_3$ is about 80° to about 145°. Sidewalls of third layer 106 have a taper angle $\theta_4$ with respect to the major surface of substrate 100. In some embodiments, taper angle $\theta_4$ is about 55° to about 100°.

Any combination is possible, according to material compositions of each of first layer 102, second layer 104, and third layer 106, and according to the etchants used in the second etching process described above in connection with FIG. 5. As described earlier, the processes described above may be used to form multi-layer structures having sidewall profiles that are tailored to a particular desired design. The etching materials (for example CF4, O2, or the like), a source power (for example a source power in a range of about 100 W to about 1500 W), an etching duration (for example an etching duration of about 25 seconds to about 250 seconds), and other etching parameters may be selected to yield multilayer structures having a particular sidewall profile. In an embodiment, the footing angle is about 89°, the re-entrant angle is about 88°, and the taper angle is about 83°. In another embodiment, the footing angle is about 60°, the re-entrant angle is about 130°, and the taper angle is about 67°. In another embodiment, the footing angle is about 64°, the re-entrant angle is about 105°, and the taper angle is about 61°.

In this manner, by varying the material compositions of first layer 102, second layer 104, and/or third layer 106, and/or the etchants and etching parameters used in the etching processes described herein, the footing angle, re-entrant angle, and taper angle may be varied, and a particular sidewall profile of multilayer structure 112 may be achieved.

In some embodiments, the different etch rates of different layers of the multilayer structure 112 may create non-continuous sidewalls of multilayer structure 112, particularly at the interfaces of different layers of the multilayer structure 112. For example, at the interface of first layer 102 and second layer 104, the sidewall of second layer 104 may be offset a distance D5 from the sidewall of first layer 102. In some embodiments, distance D5 may be about 0A to about 1000 Å. At the interface of second layer 104 and third layer 106, the sidewall of second layer 104 may be offset a distance D6 from the sidewall of third layer 106. In some embodiments, distance D6 may be about 0 Å to about 300 Å. In the embodiment discussed above where the footing angle is about 64°, the re-entrant angle is about 105°, and the taper angle is about 61°, D5 is about 16 nm and D6 is about 1 nm. In the embodiment discussed above where the footing angle is about 60°, the re-entrant angle is about 130°, and the taper angle is about 67°, D5 is about 55 nm and D6 is about 14 nm.

In some devices, it may be desirable to form multiple multilayer structures side by side. FIGS. 7 through 12 depict the formation of a multiple multilayer structures side by side on a substrate 116.

Figure 7:
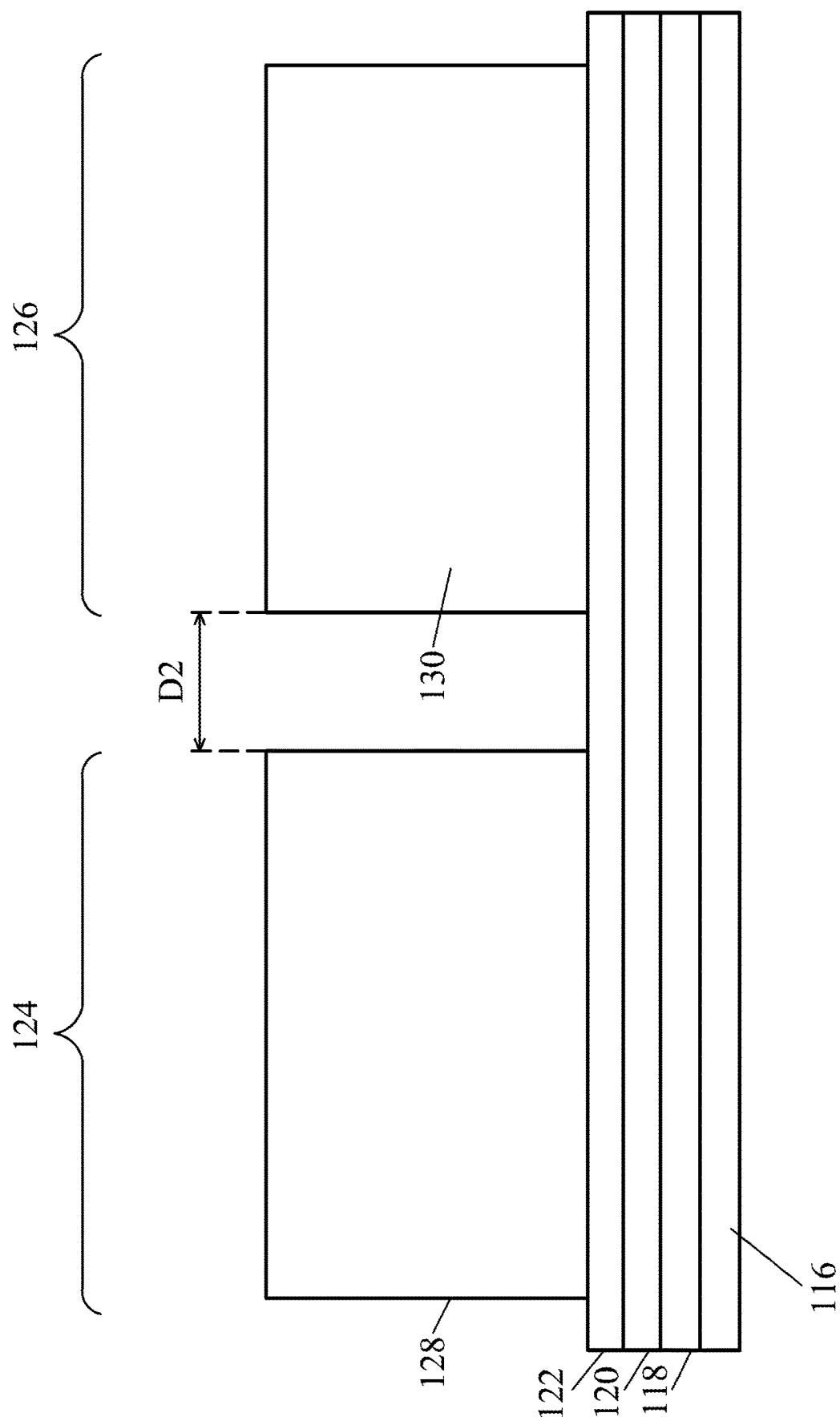

Referring to FIG. 7, a first multilayer structure may be formed in first region 124 and a second multilayer structure may be formed in second region 126. A first layer 118, a second layer 120, and a third layer 122 are formed over substrate 116. First layer 118, second layer 120, and third layer 122 may be the same as, or similar to, first layer 102, second layer 104, and third layer 106, respectively, and the discussion above of first layer 102, second layer 104, and third layer 106 is incorporated herein in full. As discussed above in connection with first layer 102, second layer 104, and third layer 106, material compositions of first layer 118, second layer 120, and/or third layer 122 may be selected according to an etch rate of the material compositions in a particular etching process, either each respective layer by itself and/or as compared to the material compositions of the other layers. For example, the material compositions of each layer, by themselves and compared to other layers, may be selected according to the etch rate of each layer in a particular etching process and desired sidewall profiles of multiple multi-layer structures being formed.

In some embodiments, first layer 118 may be formed of a same material in each of first region 124 and second region 126. In other embodiments first layer 118 may have different material compositions in first region 124 and second region 126, for example to form a multilayer structure in first region 124 that has a sidewall profile that is different from a multilayer structure in second region 126. In some embodiments, second layer 120 may be formed of a same material in each of first region 124 and second region 126. In other embodiments second layer 120 may have different material compositions in first region 124 and second region 126, for example to form a multilayer structure in first region 124 that has a sidewall profile that is different from a multilayer structure in second region 126. In some embodiments, third layer 122 may be formed of a same material in each of first region 124 and second region 126. In other embodiments third layer 122 may have different material compositions in first region 124 and second region 126, for example to form a multilayer structure in first region 124 that has a sidewall profile that is different from a multilayer structure in second region 126.

A first patterned photoresist 128 is formed over third layer 122 in first region 124 and a second patterned photoresist 130 is formed over third layer 122 in second region 126. For example, a photoresist material may be formed over third layer 122 using a spin coating process. The photoresist material may be a positive photoresist material or a negative photoresist material, and may be a single layer or tri-layer photoresist. The photoresist material is then patterned to form first patterned photoresist 128 in first region 124 and second patterned photoresist 130 in second region 126. In some embodiments, the photoresist material is patterned using one or more lithograpy and/or etching steps. As shown in FIG. 7, after the photoresist is patterned, first layer 118, second layer 120, and third layer 122 each extend laterally beyond sidewalls of first patterned photoresist 128 and second patterned photoresist 130. The thicknesses and widths of first patterned photoresist 128 and second patterned photoresist 130 may be the same as, or similar to, the thickness and width of patterned photoresist 108 discussed above in connection with FIG. 1. The thickness and/or width of first patterned photoresist 128 may be the same as the thickness and/or width of second patterned photoresist 130. In other embodiments, the thickness and/or width of first patterned photoresist 128 may be different than the thickness and/or width of second patterned photoresist 130. In some embodiments, first patterned photoresist 128 is located a minimum distance D2 from second patterned photoresist 130, where D2 is about 5000 Å to about 50000 Å.

Next, a first etching process is performed using first patterned photoresist 128 and second patterned photoresist 130 as etching masks. The first etching process may be the same as, or similar to, the first etching process described above in connection with FIG. 2, and the discussion above is incorporated herein in full. Portions of first layer 118, second layer 120, and third layer 122 that do not underlie first patterned photoresist 128 or second patterned photoresist 130 may be removed during the first etching process.

Figure 8:
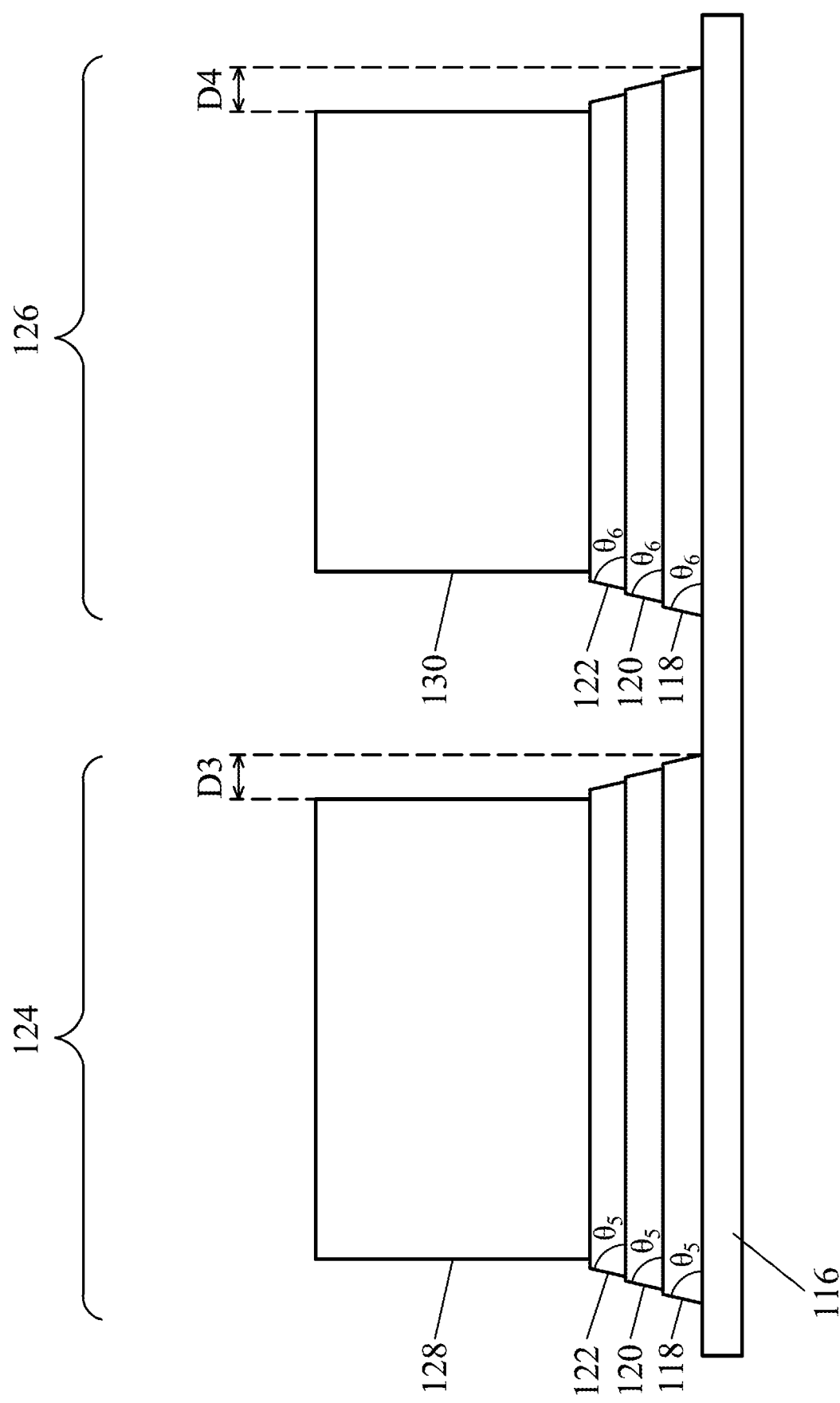

As shown in FIG. 8, after the first etching process, the multi-level structures formed by first layer 118, second layer 120, and third layer 122 in first region 124 may have sidewalls that are tapered. For example, sidewalls of first layer 118, second layer 120, and/or third layer 122 in first region 124 may extend at an angle $\theta_5$ in first region 124 with respect to a major surface of substrate 116. In some embodiments, angle $\theta_5$ may be about 60° to about 90°. An angle of a sidewall of first layer 118 in first region 124 may extend at a same angle with respect to the major surface of substrate 116 as an angle of a sidewall of second layer 120 in first region 124, or the angle of the sidewall of first layer 118 in first region 124 may extend at a different angle than the sidewall of second layer 120 in first region 124. Similarly, the angle of first layer 118 in first region 124 may extend at a same angle with respect to the major surface of substrate 116 as an angle of a sidewall of third layer 122 in first region 124, or the angle of the sidewall of first layer 118 in first region 124 may extend at a different angle than the sidewall of third layer 122 in first region 124. Further, the angle of second layer 120 in first region 124 may extend at a same angle with respect to the major surface of substrate 116 as an angle of a sidewall of third layer 122 in first region 124, or the angle of the sidewall of second layer 120 in first region 124 may extend at a different angle than the sidewall of third layer 122 in first region 124.

After the first etching process, the multi-level structures formed by first layer 118, second layer 120, and third layer 122 in second region 126 may have sidewalls that are tapered. For example, sidewalls of first layer 118, second layer 120, and/or third layer 122 in second region 126 may extend at an angle $\theta_6$ in second region 126 with respect to a major surface of substrate 116. In some embodiments, angle $\theta_6$ may be about 60° to about 90°. An angle of a sidewall of first layer 118 in second region 126 may extend at a same angle with respect to the major surface of substrate 116 as an angle of a sidewall of second layer 120 in second region 126, or the angle of the sidewall of first layer 118 in second region 126 may extend at a different angle than the sidewall of second layer 120 in second region 126. Similarly, the angle of first layer 118 in second region 126 may extend at a same angle with respect to the major surface of substrate 100 as an angle of a sidewall of third layer 122 in second region 126, or the angle of the sidewall of first layer 118 in second region 126 may extend at a different angle than the sidewall of third layer 122 in second region 126. Further, the angle of second layer 120 in second region 126 may extend at a same angle with respect to the major surface of substrate 116 as an angle of a sidewall of third layer 122 in second region 126, or the angle of the sidewall of second layer 120 in second region 126 may extend at a different angle than the sidewall of third layer 122 in second region 126.

For each of first layer 118, second layer 120, and third layer 122, when the respective layer has a same material composition in each of first region 124 and second region 126, the angles formed by the sidewalls of the respective layer in the first region 124 and the second region 126 may be the same. When the respective layer has a different material composition in first region 124 than in second region 126, the angles formed by the sidewalls of the respective layer in the first region 124 and the second region 126 may be different.

As shown in FIG. 8, after the first etching process terminates the edges of first layer 118, second layer 120, and/or third layer 122 may extend laterally beyond the edges of first patterned photoresist 128. For example, third layer 122 may extend a distance D3 beyond one or more edges of first patterned photoresist 128. In some embodiments, D3 is about 200 Å to about 5000 Å. Further, after the first etching process terminates the edges of first layer 118, second layer 120, and/or third layer 122 may extend laterally beyond the edges of second patterned photoresist 130. For example, third layer 122 may extend a distance D4 beyond one or more edges of second patterned photoresist 130. In some embodiments, D4 is about 200 Å to about 5000 Å. Distances D3 may be the same as distance D4 or different, for example depending on the material composition of third layer 122 in first region 124 and second region 126 and/or the etchant(s) used in the first etching process.

Figure 9:
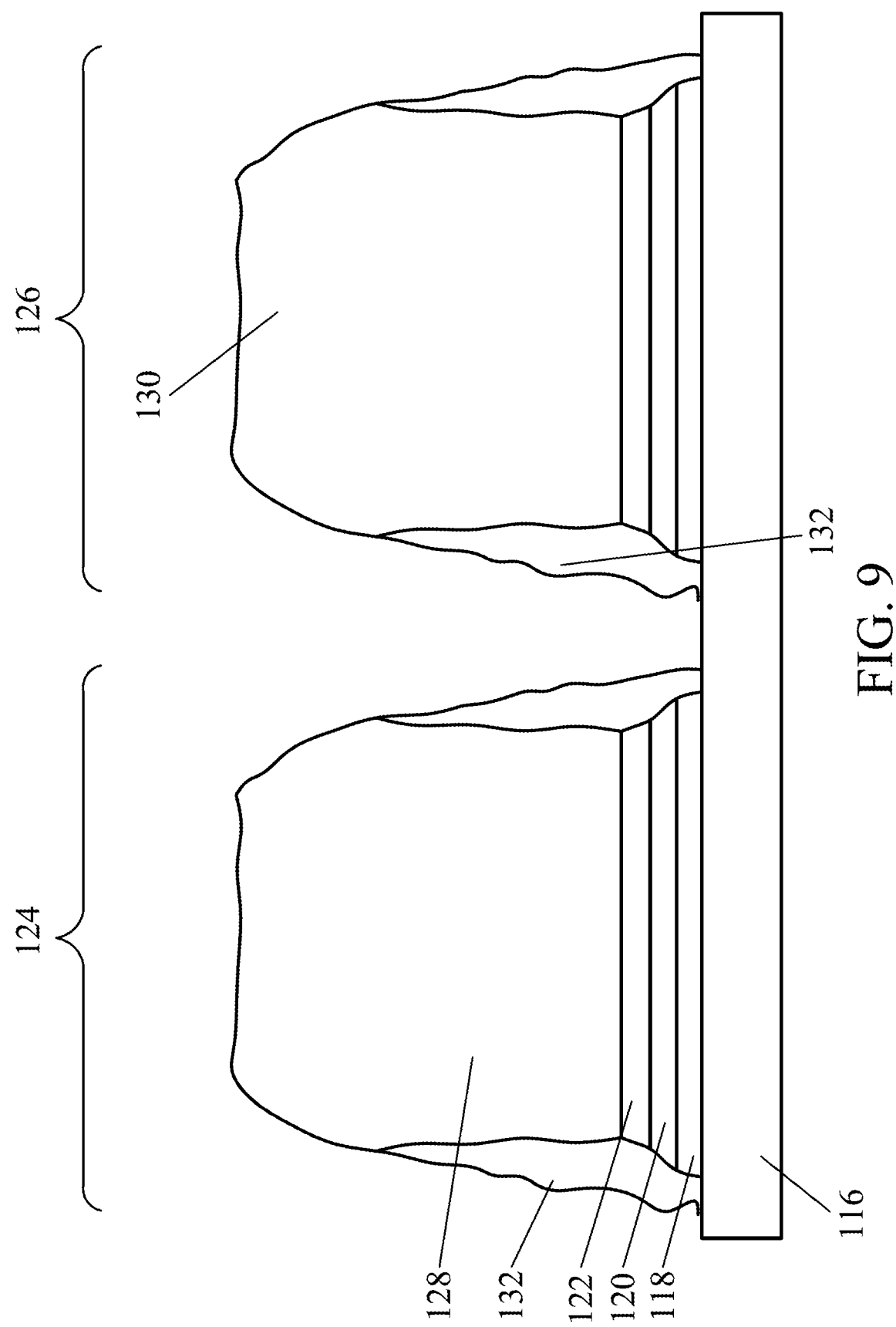

Next, referring to FIG. 9, a polymer 132 is formed along edges of first patterned photoresist 128 and second patterned photoresist 130, and along sidewalls of first layer 118, second layer 120, and third layer 122. In some embodiments, polymer 132 is deposited, for example using CVD, ALD, PVD, PECVD, or the like. In each of first region 124 and second region 126, a thickness of polymer 132 may be thinnest at a top portion of polymer 132 and thicker at a bottom portion of polymer 132, and a thickness of polymer 132 may vary according to height. The bottom portions of polymer 132 may contact substrate 116.

Figure 10:
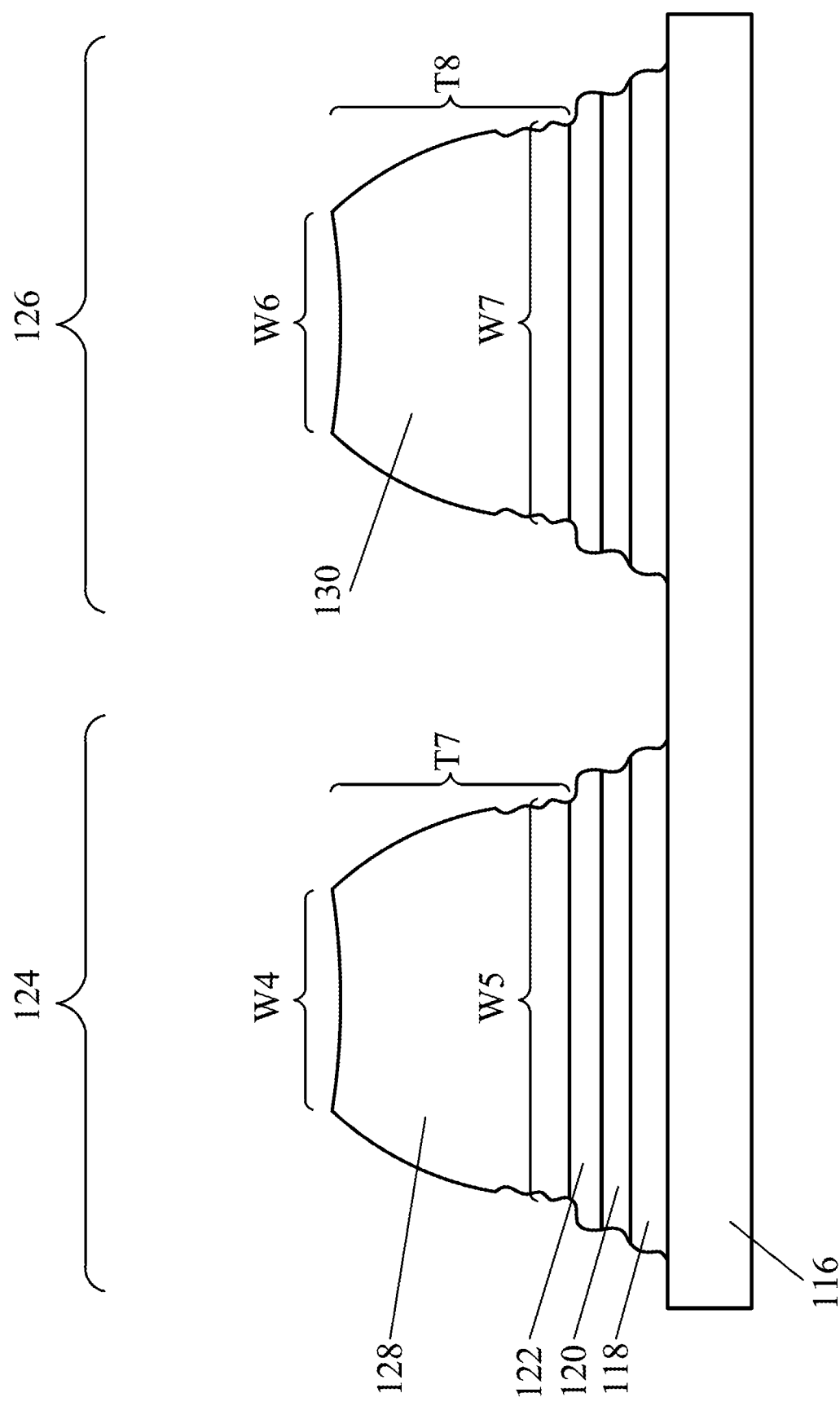

Referring to FIG. 10, polymer 132 is removed. In some embodiments, polymer 132 may be removed using an $O_2$ ashing process. The $O_2$ ashing process may consume a portion of first patterned photoresist 128 and/or second patterned photoresist 130. For example, a thickness of the first patterned photoresist 128 and/or the second patterned photoresist 130 may be reduced by the $O_2$ ashing process. In some embodiments, after the $O_2$ ashing process the first patterned photoresist 128 may have a thickness T7. Thickness T7 may be about 1500 Å to about 10000 Å. In some embodiments, after the $O_2$ ashing process the second patterned photoresist 130 may have a thickness T8. Thickness T8 may be about 1500 Å to about 10000 Å.

After the $O_2$ ashing process, the first patterned photoresist 128 and/or the second patterned photoresist 130 may have top surfaces that are concave or otherwise non-planar. In other embodiments, the first patterned photoresist 128 and/or the second patterned photoresist 130 may have top surfaces that are planar after the $O_2$ ashing process.

After the $O_2$ ashing process, the first patterned photoresist 128 and/or the second patterned photoresist 130 may have tapered sidewalls. For example, a width of the first patterned photoresist 128 and/or a width of the second patterned photoresist 130 may vary according to height. A width W4 of the top surface of first patterned photoresist 128 after the $O_2$ ashing process may be about 2000 Å to about 10000 Å. A width W5 of the bottom surface of the first patterned photoresist 128 after the $O_2$ ashing process may be about 4000 Å to about 16000 Å. A width W6 of the top surface of second patterned photoresist 130 after the $O_2$ ashing process may be about 2000 Å to about 10000 Å. A width W7 of the bottom surface of the second patterned photoresist 130 after the $O_2$ ashing process may be about 4000 Å to about 16000 Å. A top surface of third layer 122 may be exposed by the consuming of the first patterned photoresist 128 and/or the second patterned photoresist 130 by the $O_2$ ashing process.

In some embodiments, a portion of one or more of first layer 118, second layer 120, and/or third layer 122 may also be consumed by the $O_2$ ashing process.

Figure 11:
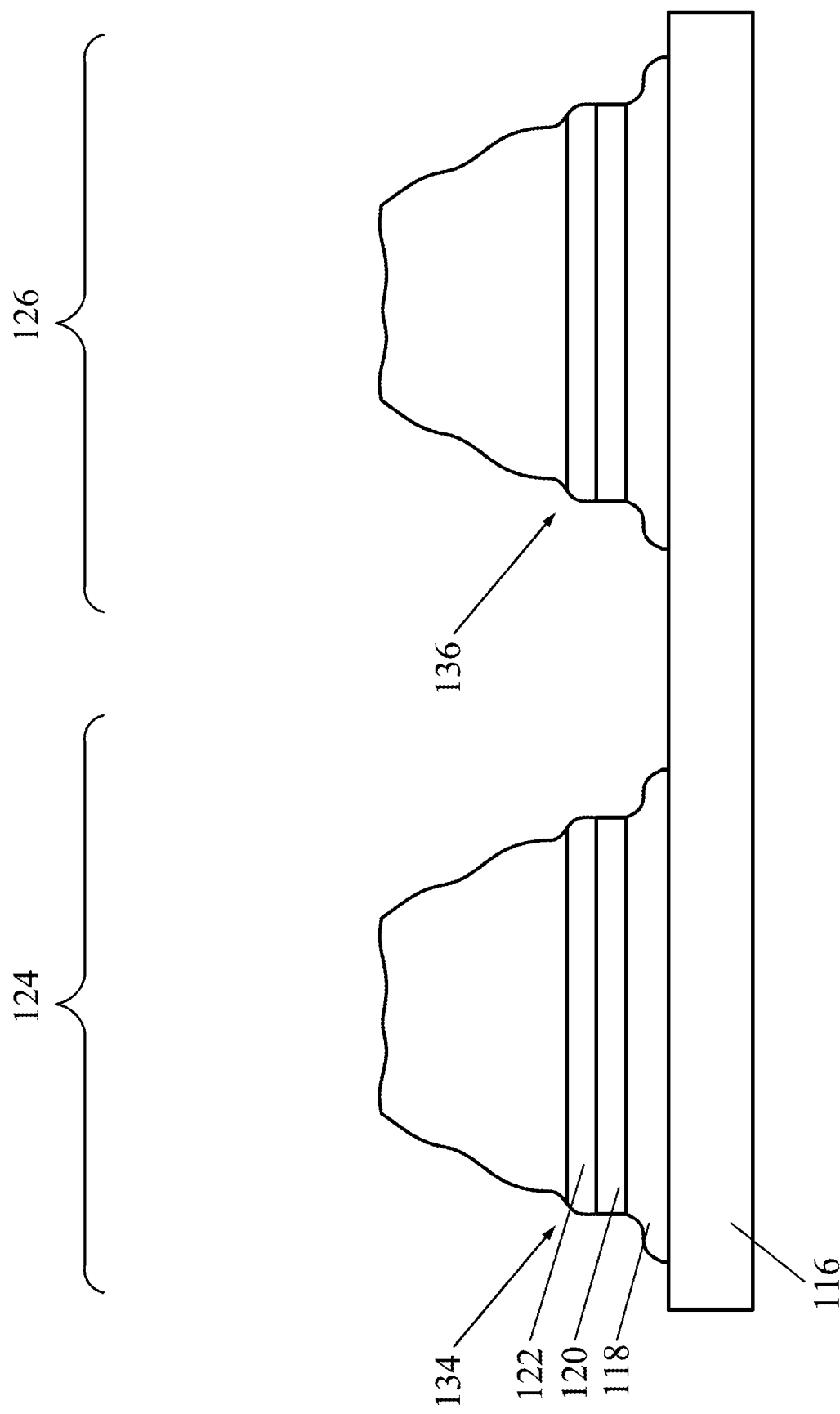

Next, referring to FIG. 11, a second etching process is performed using the first patterned photoresist 128 and the second patterned photoresist 130 as etch masks. The second etching process may be the same as the second etching process described above in connection with FIG. 5, and the discussion above is incorporated herein in full.

The second etching process may continue until a desired profile of combined sidewalls of first layer 118, second layer 120, and third layer 122 are achieved in first region 124 and second region 126. For example, FIG. 11 depicts a particular sidewall profile of a first multilayer structure 134 formed by first layer 118, second layer 120, and third layer 122 in first region 124, and a particular sidewall profile of a second multilayer structure 136 formed by first layer 118, second layer 120, and third layer 122 in second region 126. When the desired sidewall profiles of multilayer structures 134 and 136 are achieved, the second etching process may terminate. In some embodiments, the achieving of the desired sidewall profiles may be determined according to an elapsed time of the second etching process. In some embodiments, the achieving of the desired sidewall profiles may be determined using measurement. The desired sidewall profiles of the multilevel structures formed in the first region 124 and the second region 126 may be the same or different.

Figure 12:
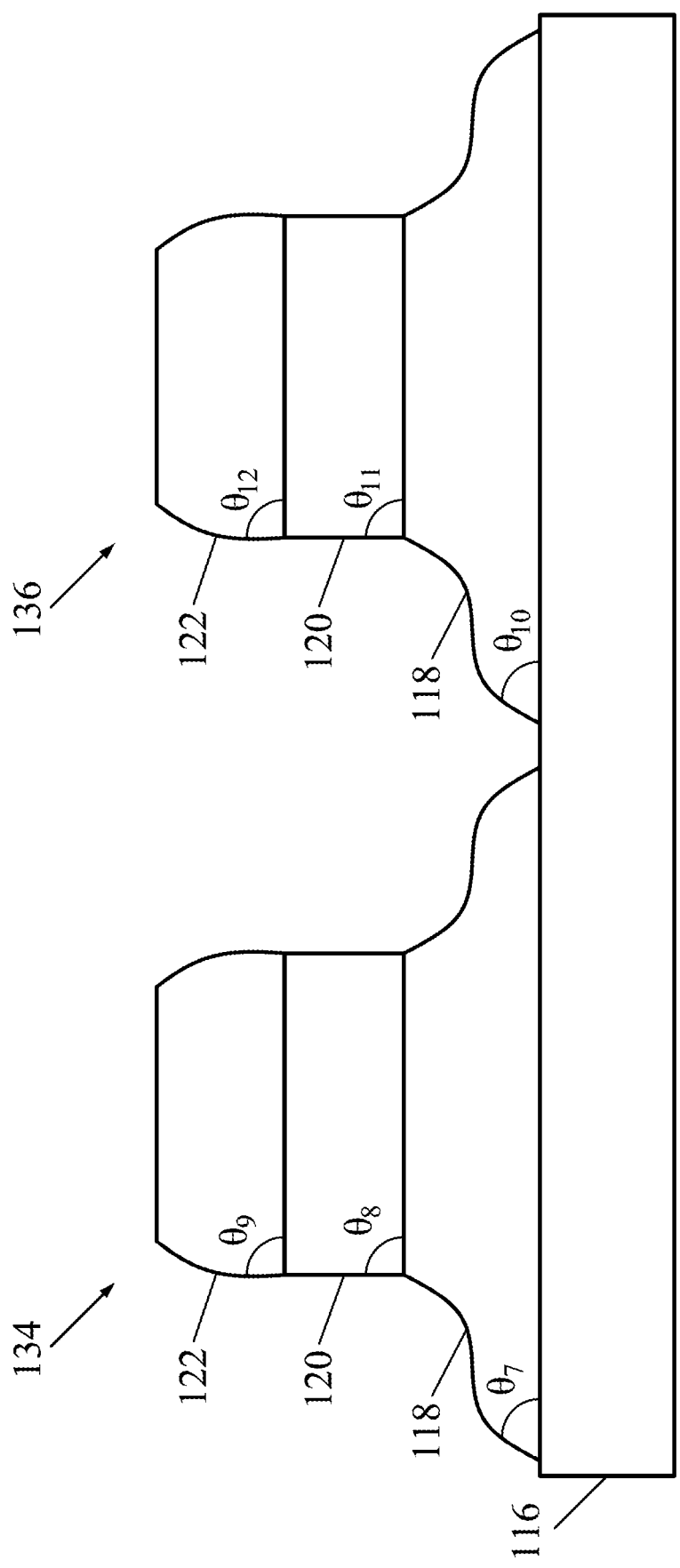

Next, the first patterned photoresist 128 and the second patterned photoresist 130 are removed, for example using an ashing process. The resulting structure is shown in FIG. 12. FIG. 12 depicts an expanded view of the multilayer structures shown in FIG. 11. A first multilayer structure 134, as depicted in FIG. 12, includes first layer 118, second layer 120, and third layer 122. Each of first layer 118, second layer 120, and third layer 122 comprised in first multilayer structure 134 of FIG. 12 have respective sidewalls that form respective angles with respect to a major surface of substrate 116. For example, sidewalls of first layer 118 of first multilayer structure 134 have a footing angle $\theta_7$ with respect to the major surface of substrate 116. In some embodiments, footing angle $\theta_7$ is about 55° to about 90°. Sidewalls of second layer 120 of first multilayer structure 134 have a re-entrant angle $\theta_8$ with respect to the major surface of substrate 116. In some embodiments, re-entrant angle $\theta_8$ is about 80° to about 145°. Sidewalls of third layer 122 of first multilayer structure 134 have a taper angle $\theta_9$ with respect to the major surface of substrate 116. In some embodiments, taper angle $\theta_9$ is about 55° to about 116°.

Any combination is possible, according to material compositions of each of first layer 118, second layer 120, and third layer 122, and according to the etchants used in the second etching process described above in connection with FIG. 11. For example, as described above in connection with FIG. 6, in an embodiment, the footing angle of first multilayer structure 134 is about 89°, the re-entrant angle of first multilayer structure 134 is about 88°, and the taper angle of first multilayer structure 134 is about 83°. In another embodiment, the footing angle of first multilayer structure 134 is about 60°, the re-entrant angle of first multilayer structure 134 is about 130°, and the taper angle of first multilayer structure 134 is about 67°. In another embodiment, the footing angle of first multilayer structure 134 is about 64°, the re-entrant angle of first multilayer structure 134 is about 105°, and the taper angle of first multilayer structure 134 is about 61°. In this manner, by varying the materials used and the parameters and etchants of the etching processes as described herein, a particular footing angle, re-entrant angle, and taper angle may be formed, and a particular sidewall profile of first multilayer structure 134 may be achieved.

A second multilayer structure 136, as depicted in FIG. 12, includes first layer 118, second layer 120, and third layer 122. Each of first layer 118, second layer 120, and third layer 122 comprised in second multilayer structure 136 have respective sidewalls that form respective angles with respect to a major surface of substrate 116. For example, sidewalls of first layer 118 of second multilayer structure 136 have a footing angle $\theta_{10}$ with respect to the major surface of substrate 116. In some embodiments, footing angle $\theta_{10}$ is about 55° to about 90°. Footing angle $\theta_{10}$ may be the same as footing angle $\theta_7$ or may be different than footing angle $\theta_7$, for example depending on material compositions of first layer 118 in first region 124 and second region 126. Sidewalls of second layer 120 of second multilayer structure 136 have a re-entrant angle $\theta_{11}$ with respect to the major surface of substrate 116. In some embodiments, re-entrant angle $\theta_{11}$ is about 80° to about 145°. Re-entrant angle $\theta_{11}$ may be the same as re-entrant angle $\theta_8$ or may be different than re-entrant angle $\theta_8$, for example depending on material compositions of second layer 120 in first region 124 and second region 126. Sidewalls of third layer 122 of second multilayer structure 136 have a taper angle $\theta_{12}$ with respect to the major surface of substrate 116. In some embodiments, taper angle $\theta_{12}$ is about 55° to about 116°. Taper angle $\theta_{12}$ may be the same as taper angle $\theta_9$ or may be different than taper angle $\theta_9$, for example depending on material compositions of third layer 122 in first region 124 and second region 126.

Any desired sidewall profile of second multilayer structure 136 is possible, according to material compositions of each of first layer 118, second layer 120, and third layer 122, and according to the etchants used in the second etching process described above in connection with FIG. 11. In an embodiment, the footing angle of second multilayer structure 136 is about 83°, the re-entrant angle of second multilayer structure 136 is about 88°, and the taper angle of second multilayer structure 136 is about 89°. In another embodiment, the footing angle of second multilayer structure 136 is about 67°, the re-entrant angle of second multilayer structure 136 is about 130°, and the taper angle of second multilayer structure 136 is about 60°. In another embodiment, the footing angle of second multilayer structure 136 is about 61°, the re-entrant angle of second multilayer structure 136 is about 105°, and the taper angle of second multilayer structure 136 is about 64°. In this manner, by varying the footing angle, re-entrant angle, and taper angle, a particular sidewall profile of second multilayer structure 136 may be achieved.

Figure 13:
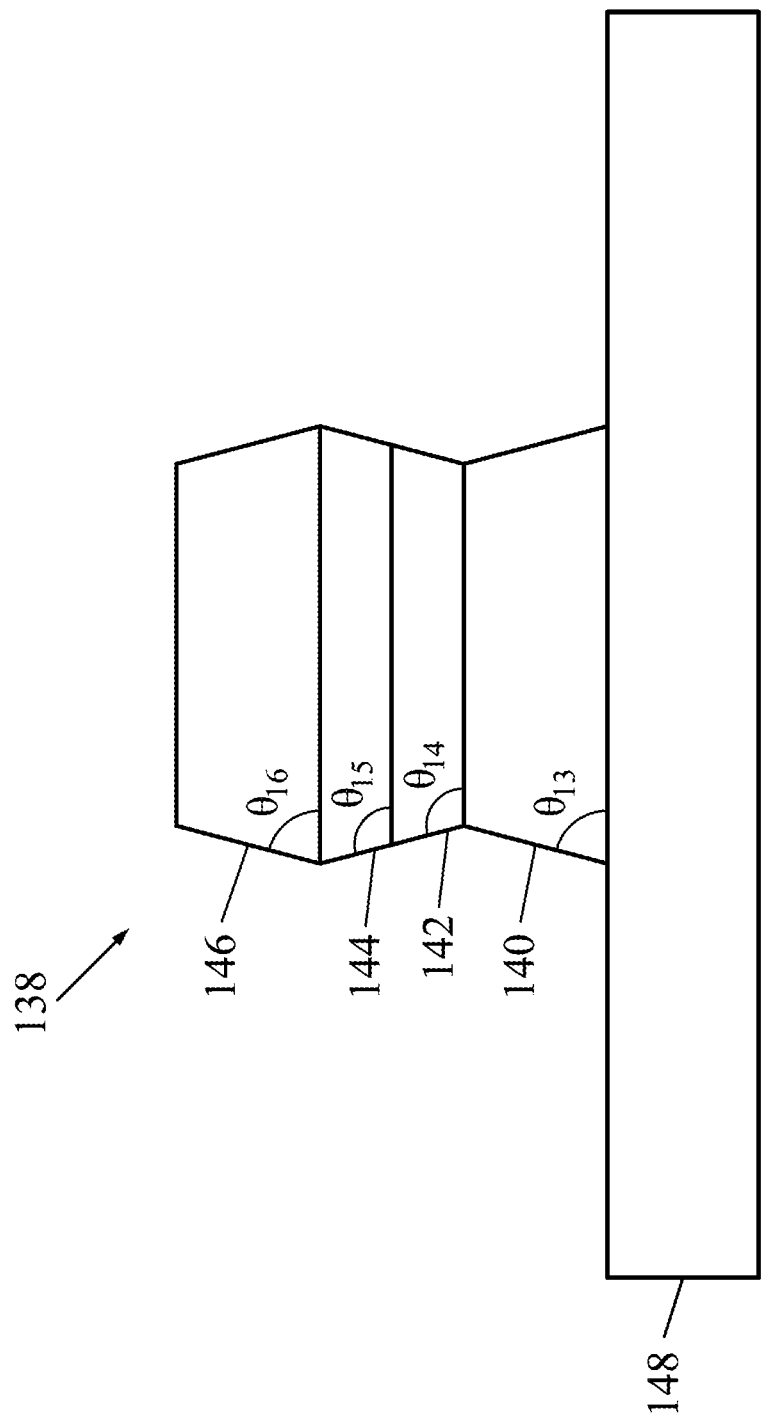

FIGS. 1-12 depict the formation of multilevel structures that have three layers. In some embodiments, the processes described above may be used to form multilayer structures that comprise more than three layers. FIG. 13 depicts a multilayer structure 138 that includes four layers. First layer 140 may be the same as, or similar to, first layer 102 discussed above in connection with FIG. 1, and the discussion above is incorporated herein. Second layer 142 and third layer 144 may each be the same as, or similar to, second layer 104 discussed above in connection with FIG. 1, and the discussion above is incorporated herein. In some embodiments, a material composition of second layer 142 and third layer 144 are different. In other embodiments the material composition of second layer 142 and third layer 144 are the same. Fourth layer 146 may be the same as, or similar to third layer 106 discussed above in connection with FIG. 1, and the discussion above of third layer 106 is incorporated herein. Multilayer structure 138 may be formed using the processes described above in connection with FIGS. 1-12.

As shown in FIG. 13, a sidewall of first layer 140 may form a footing angle $\theta_{13}$ with respect to a major surface of substrate 148. In some embodiments, footing angle $\theta_{13}$ may be the same as, or similar to, footing angle $\theta_2$ described above in connection with FIG. 6, and the discussion above of footing angle $\theta_2$ is incorporated herein. A sidewall of second layer 142 may form a re-entrant angle $\theta_{14}$ with respect to the major surface of substrate 148. In some embodiments, re-entrant angle $\theta_{14}$ may be the same as, or similar to, re-entrant angle $\theta_3$ described above in connection with FIG. 6, and the discussion above of re-entrant angle $\theta_3$ is incorporated herein. A sidewall of third layer 144 may form a re-entrant angle $\theta_{15}$ with respect to the major surface of substrate 148. In some embodiments, re-entrant angle $\theta_{15}$ may be the same as, or similar to, re-entrant angle $\theta_3$ described above in connection with FIG. 6, and the discussion above of re-entrant angle $\theta_3$ is incorporated herein. Re-entrant angles $\theta_{14}$ and $\theta_{15}$ may be the same or may be different. A sidewall of fourth layer 146 may form a taper angle $\theta_{16}$ with respect to the major surface of substrate 148. In some embodiments, taper angle $\theta_{16}$ may be the same as, or similar to, taper angle $\theta_4$ described above in connection with FIG. 6, and the discussion above of taper angle $\theta_4$ is incorporated herein.

Figure 14:
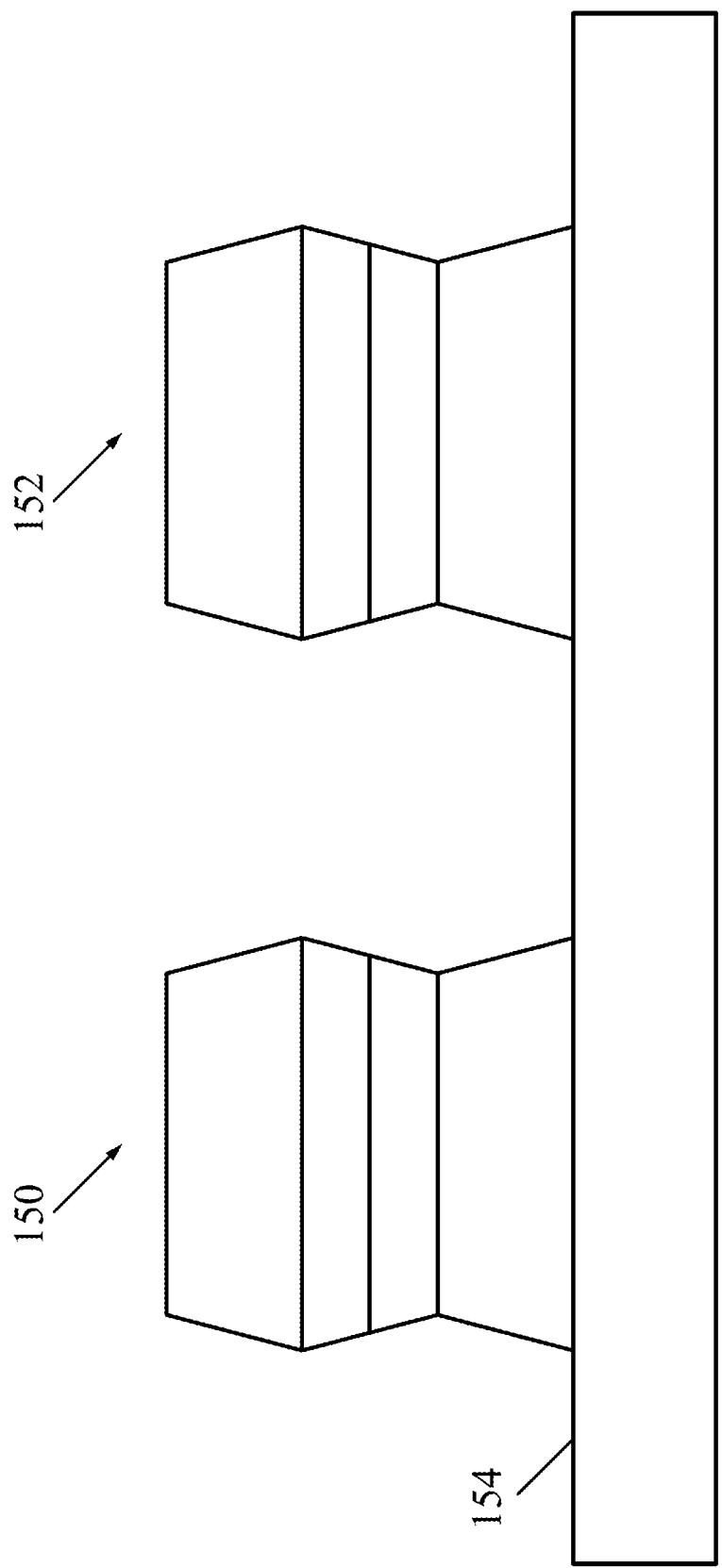

Various embodiments may be formed using the processes discussed above. Referring to FIG. 14, a structure is shown that includes a first multilayer structure 150 and a second multilayer structure 152 formed side-by-side on a substrate 154. Each of first multilayer structure 150 and second multilayer structure 152 has four layers, for example as described above in connection with FIG. 13. First multilayer structure 150 and second multilayer structure 152 may be simultaneously formed, for example as described in connection with FIGS. 7-12. First multilayer structure 150 may be substantially the same as second multilayer structure 152, or first multilayer structure 150 may be different that second multilayer structure 152. For example, the material compositions of the layers of first multilayer structure 150 may be the same as the layers of second multilayer structure 152. In this case, the sidewall profiles of first multilayer structure 150 may be substantially the same as the sidewall profiles of second multilayer structure 152. In other embodiments, the material composition of one or more layers of first multilayer structure 150 may be different than one or more layers of second multilayer structure 152. In this case, the sidewall profiles of first multilayer structure 150 may be different than the sidewall profiles of second multilayer structure 152.

Figure 15:
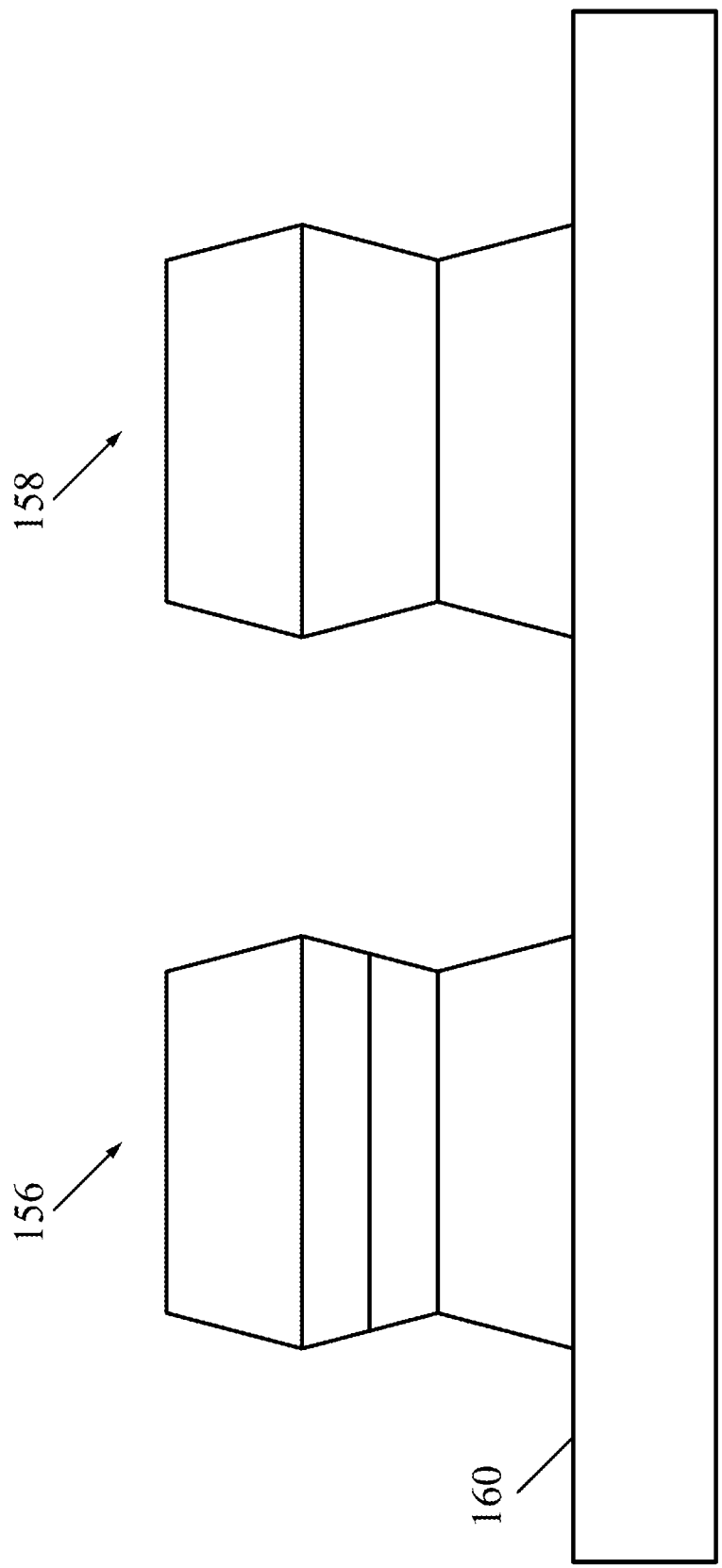

FIG. 15 depicts a structure that includes a first multilayer structure 156 and a second multilayer structure 158 formed side-by-side on a substrate 160. The first multilayer structure 156 has four layers and the second multilayer structure 152 has three layers, for example as described above in connection with FIGS. 6 and 13. First multilayer structure 156 and second multilayer structure 158 may be simultaneously formed, for example as described in connection with FIGS. 7-12.

Figure 16:
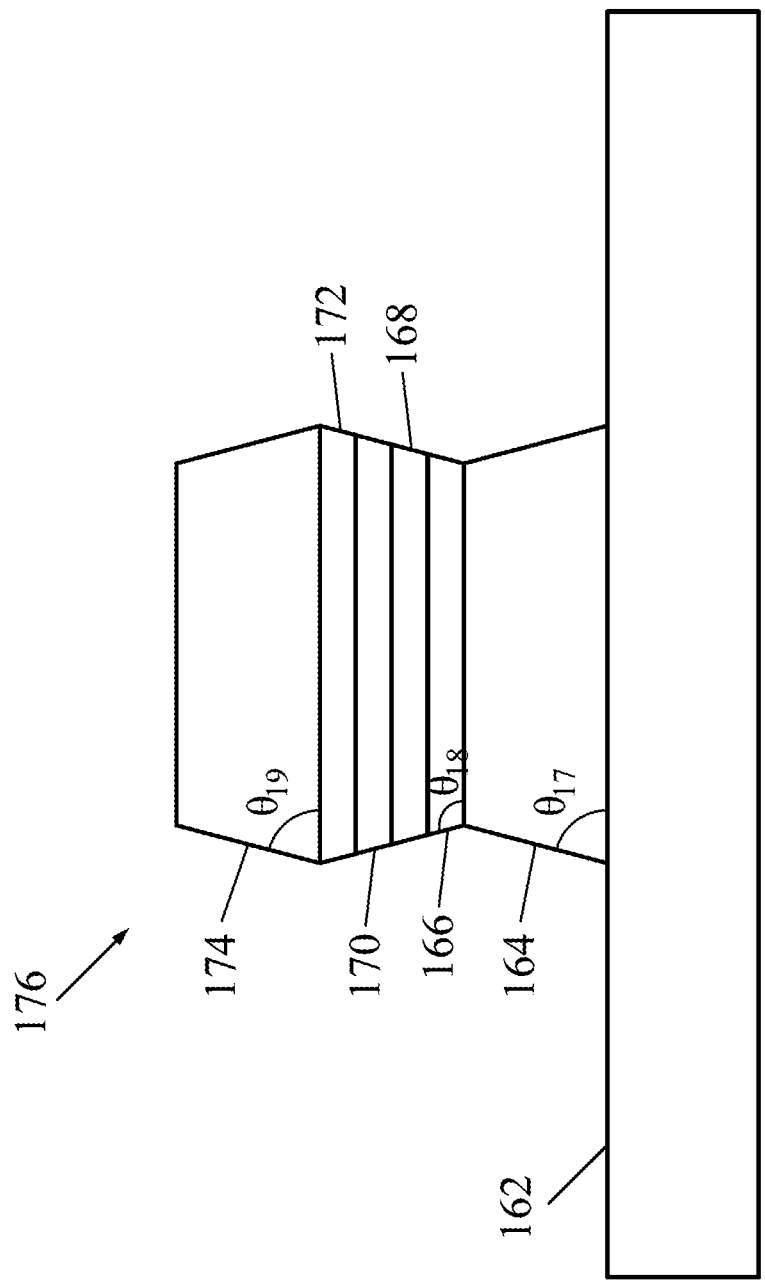

FIG. 16 depicts a multilayer structure 176 that may be formed, for example, using the processes discussed above in connection with FIGS. 1-6. Multilayer structure 176 may include a bottom layer 164. Bottom layer 164 may be the same as, or similar to, first layer 102 discussed above in connection with FIG. 1, and the discussion above is incorporated herein. Multilayer structure 176 also includes middle layers 166, 168, 170, and 172. Middle layers 166, 168, 170, and 172 may each be the same as, or similar to, second layer 104 discussed above in connection with FIG. 1, and the discussion above is incorporated herein. Although four middle layers 166, 168, 170, and 172 are depicted in FIG. 16, in other embodiments additional middle layers or fewer middle layers may be used. In some embodiments, material compositions of middle layers 166, 168, 170, and 172 may be different from each other. In other embodiments the material composition of middle layers 166, 168, 170, and 172 may be the same. Multilayer structure 176 also includes top layer 174. Top layer 174 may be the same as, or similar to third layer 106 discussed above in connection with FIG. 1, and the discussion above of third layer 106 is incorporated herein. Multilayer structure 176 may be formed using the processes described above in connection with FIGS. 1-12.

As shown in FIG. 16, a sidewall of bottom layer 164 may form a footing angle $\theta_{17}$ with respect to a major surface of substrate 162. In some embodiments, footing angle $\theta_{17}$ may be the same as, or similar to, footing angle $\theta_2$ described above in connection with FIG. 6, and the discussion above of footing angle $\theta_2$ is incorporated herein. A sidewall of each of middle layers 166, 168, 170, and 172 may each respectively form a re-entrant angle $\theta_{18}$ with respect to the major surface of substrate 162. In some embodiments, the re-entrant angle $\theta_{18}$ of a respective middle layer may be the same as, or similar to, re-entrant angle $\theta_3$ described above in connection with FIG. 6, and the discussion above of re-entrant angle $\theta_3$ is incorporated herein. The re-entrant angle of each of the middle layers 166, 168, 170, and 172 may be the same as each other, or may be different from each other. A sidewall of top layer 174 may form a taper angle $\theta_{19}$ with respect to the major surface of substrate 162. In some embodiments, taper angle $\theta_{19}$ may be the same as, or similar to, taper angle $\theta_4$ described above in connection with FIG. 6, and the discussion above of taper angle $\theta_4$ is incorporated herein.

Figure 17:
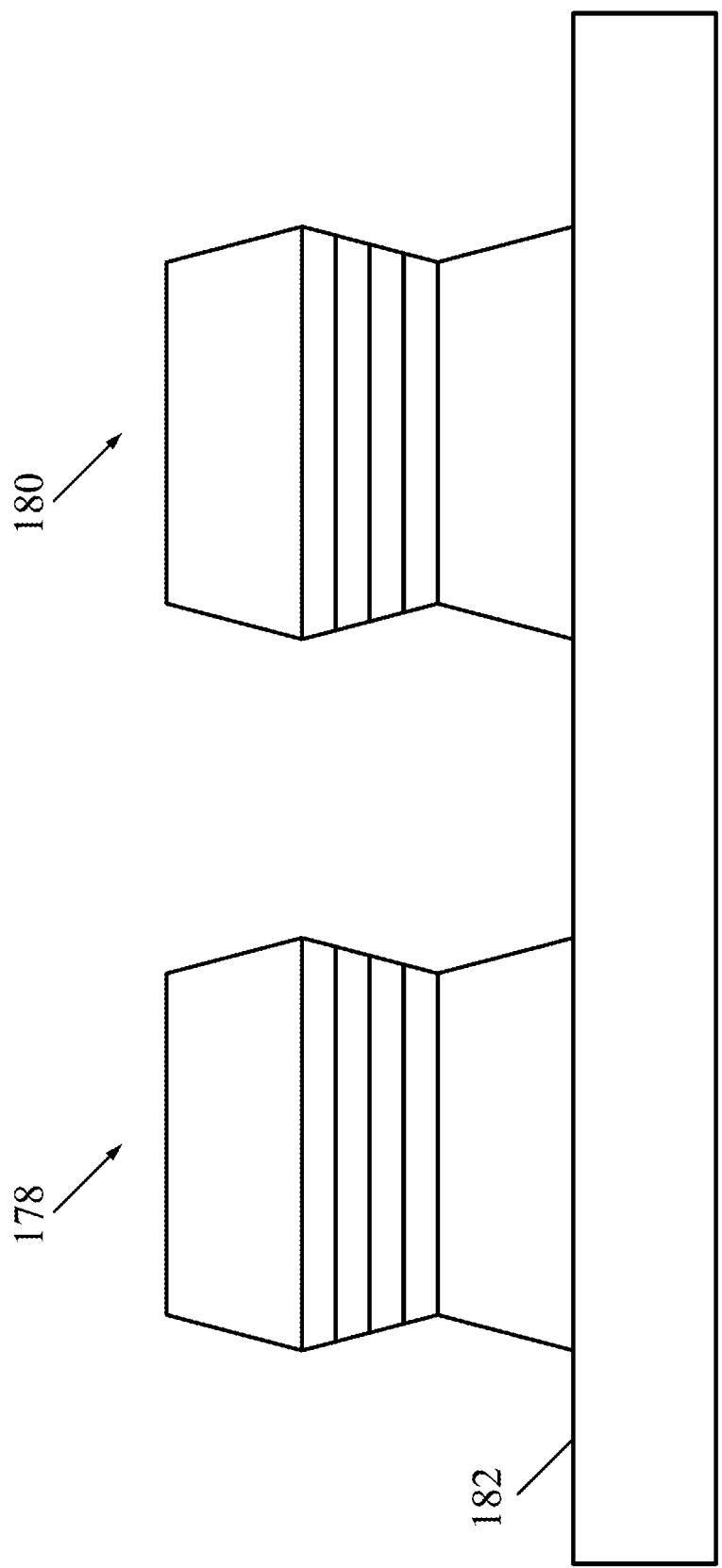

FIG. 17 depicts a structure in which a first multilayer structure 178 and a second multilayer structure 180 are formed next to each other on a substrate 182. Each of first multilayer structure 178 and second multilayer structure 180 may be similar to multilayer structure 176 shown in FIG. 16, and the discussion of multilayer structure 176 is incorporated herein. First multilayer structure 178 and second multilayer structure 180 may be simultaneously formed using the processes described above in connection with FIGS. 7-12.

Figure 18:
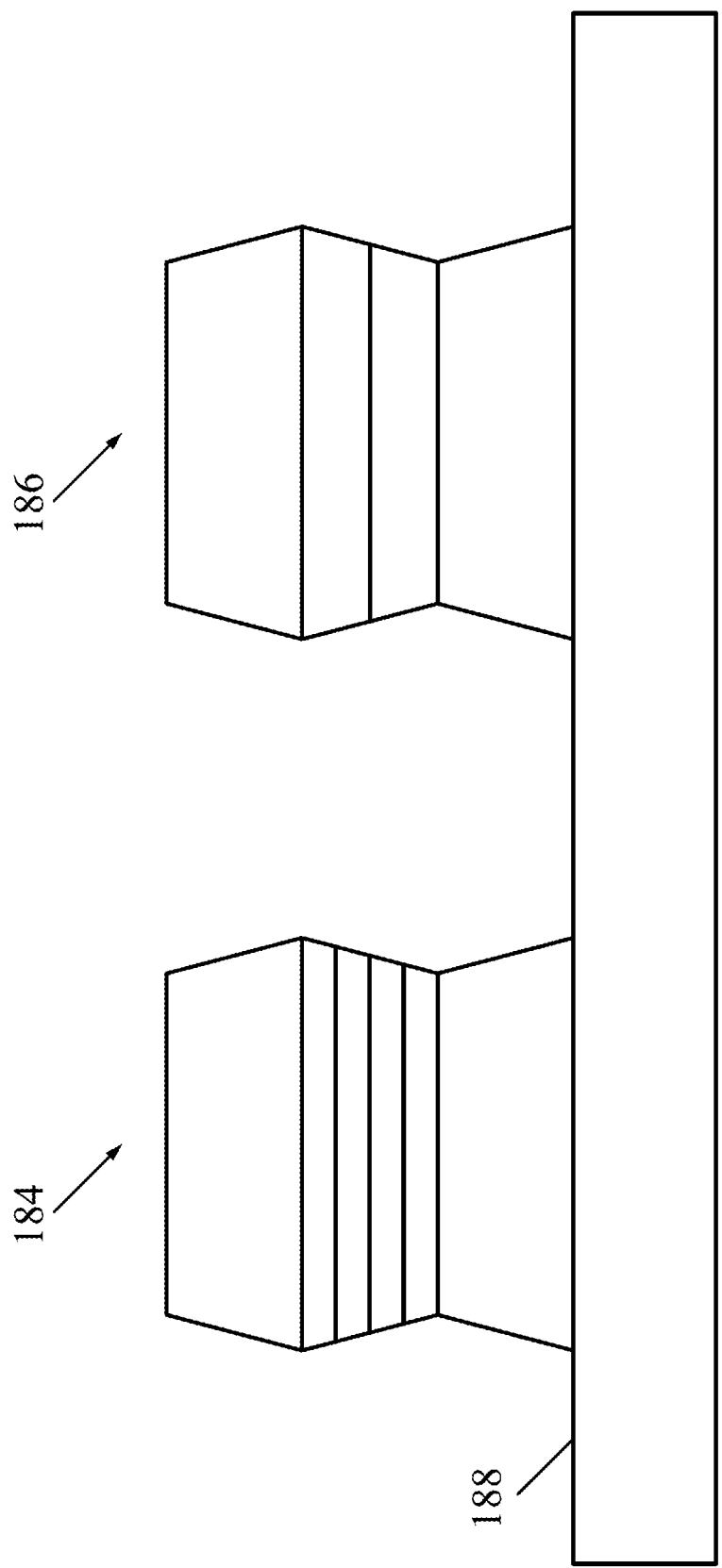

FIG. 18 depicts a structure in which a first multilayer structure 184 and a second multilayer structure 186 are formed next to each other on a substrate 188. First multilayer structure 184 may be similar to multilayer structure 176 shown in FIG. 16, and the discussion of multilayer structure 176 is incorporated herein. Second multilayer structure 186 may be similar to multilayer structure 138 shown in FIG. 13, and the discussion of multilayer structure 138 is incorporated herein. First multilayer structure 184 and second multilayer structure 186 may be simultaneously formed using the processes described above in connection with FIGS. 7-12.

Figure 19:
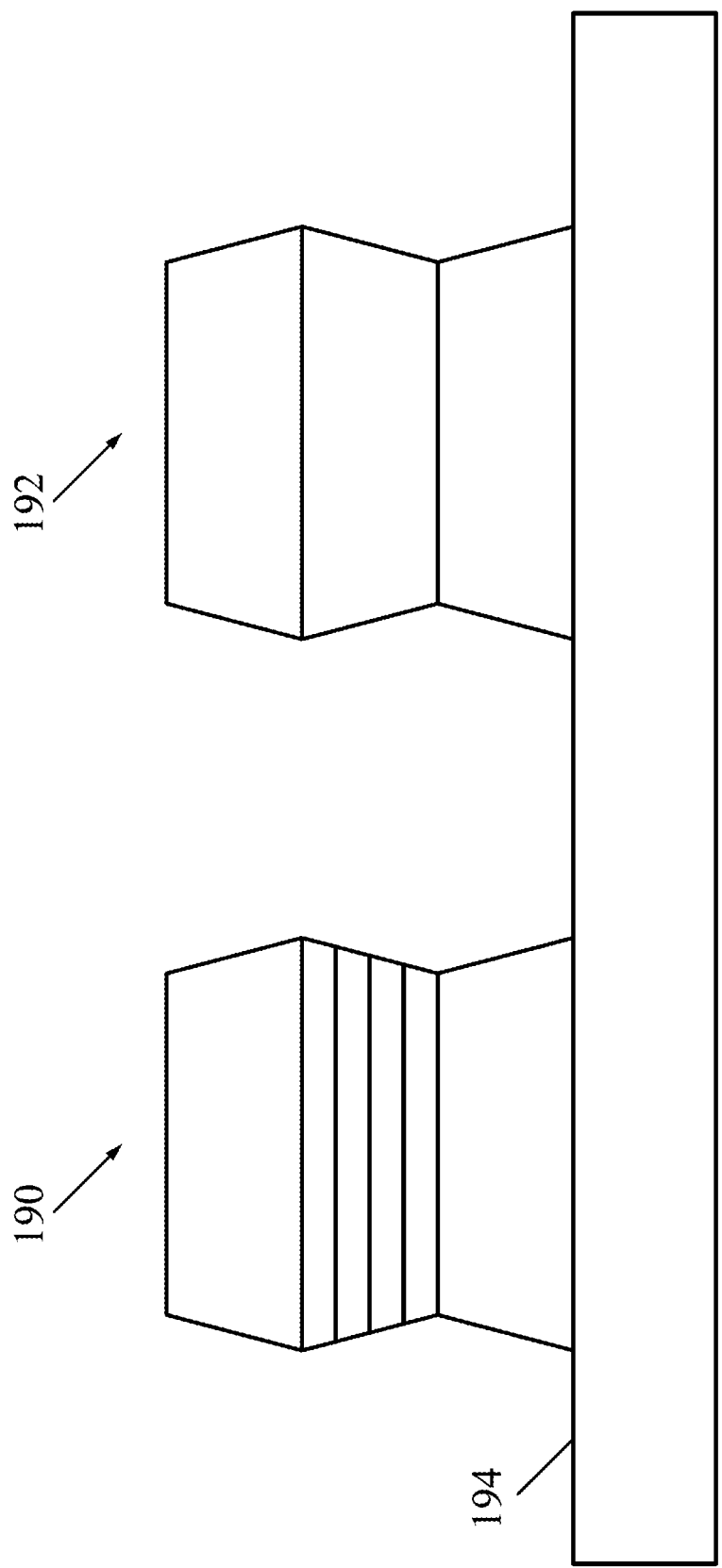

FIG. 19 depicts a structure in which a first multilayer structure 190 and a second multilayer structure 192 are formed next to each other on a substrate 194. First multilayer structure 190 may be similar to multilayer structure 176 shown in FIG. 16, and the discussion of multilayer structure 176 is incorporated herein. Second multilayer structure 192 may be similar to multilayer structure 112 shown in FIG. 6, and the discussion of multilayer structure 112 is incorporated herein. First multilayer structure 190 and second multilayer structure 192 may be simultaneously formed using the processes described above in connection with FIGS. 7-12.

Figure 20:
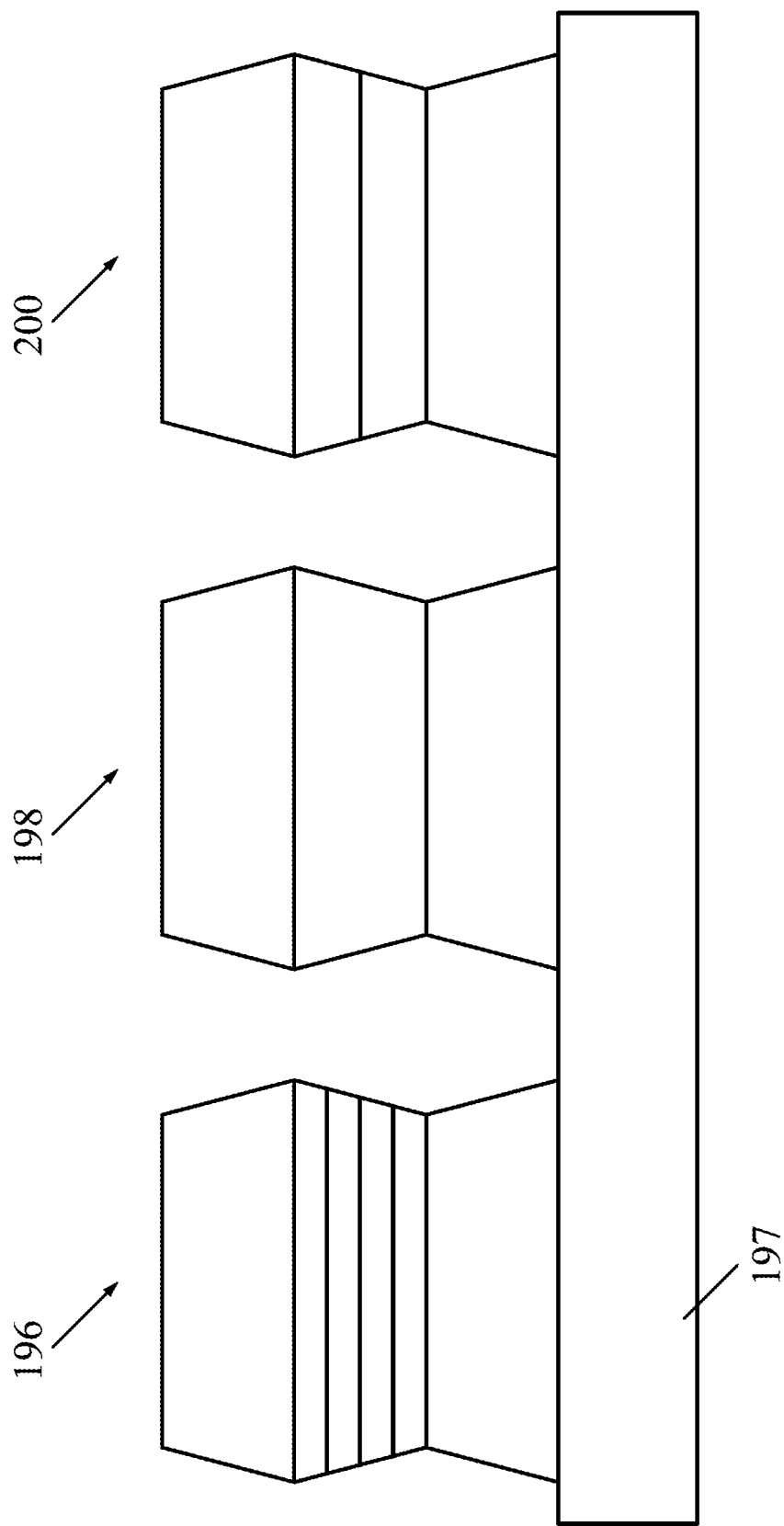

FIG. 20 depicts a structure in which a first multilayer structure 196, a second multilayer structure 198, and a third multilayer structure 200 are formed next to each other on a substrate 197. First multilayer structure 196 may be similar to multilayer structure 176 shown in FIG. 16, and the discussion of multilayer structure 176 is incorporated herein. Second multilayer structure 198 may be similar to multilayer structure 112 shown in FIG. 6, and the discussion of multilayer structure 112 is incorporated herein. Third multilayer structure 200 may be similar to multilayer structure 138 shown in FIG. 13, and the discussion of multilayer structure 138 is incorporated herein. First multilayer structure 196, second multilayer structure 198, and third multilayer structure 200 may be simultaneously formed using the processes described above in connection with FIGS. 7-12.

Many different applications of the above embodiments are possible. In some embodiments, multilayer structures as described herein may be used in the formation of a sandwich architecture for an integrated Si-nanosystem device, for example for sensor applications, display applications, MEMS applications, and the like.

Figure 21:
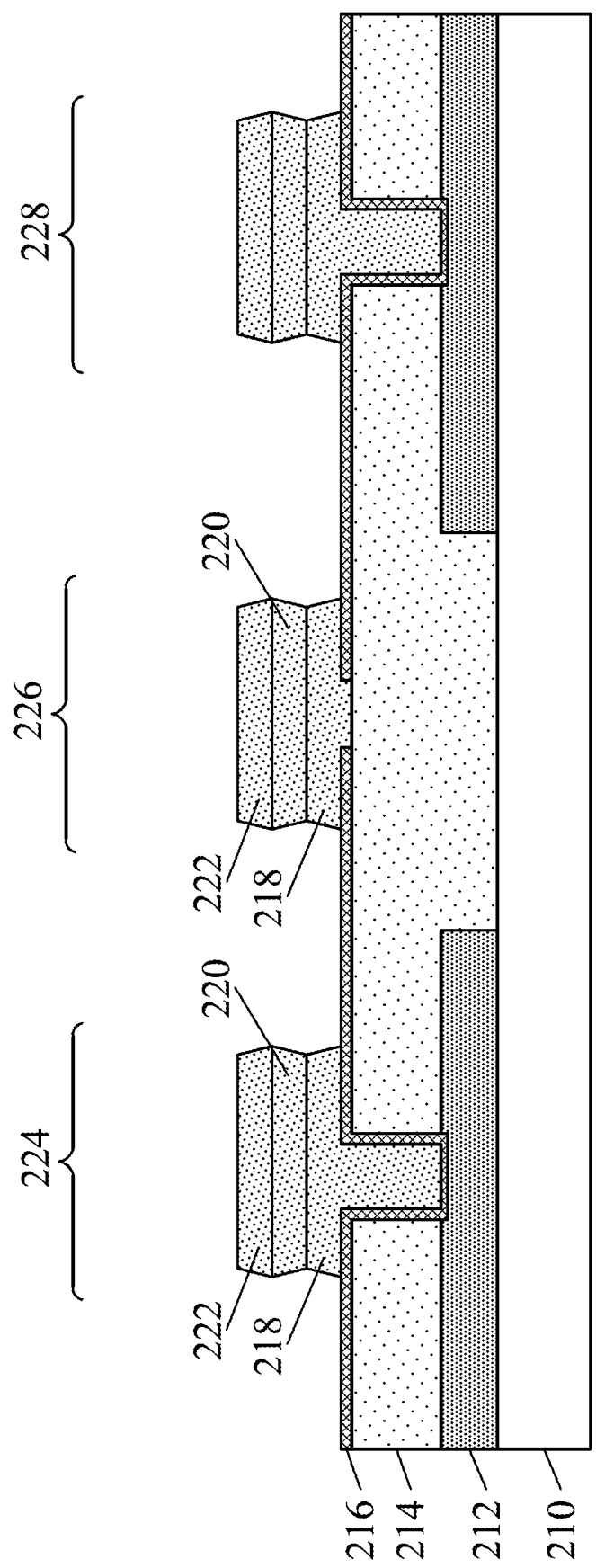

FIGS. 21-25 depict intermediate stages in the formation of a sandwich architecture for an integrated Si-nanosystem device including multilayer structures as described herein. Referring to FIG. 21, a substrate 210 is depicted. Any suitable substrate 210 may be used. In some embodiments, substrate 210 may include an integrated circuit that includes one or more active devices, passive devices, and electrical circuits. For example substrate 210 may include a complementary metal-oxide-semiconductor (CMOS) chip. In other embodiments, substrate 210 may be free of active devices, and may include only passive devices or electrical connectors. In other embodiments, substrate 210 may be free of any active devices, passive devices, or electrical connectors. Any suitable materials may be used to form substrate 210.

Electrical connectors 212 are formed on substrate 210. In some embodiments, electrical connectors 212 are formed of a conductive material, such as a metal. For example, electrical connectors 212 may be formed of aluminum, copper, a combination thereof, or the like. Electrical connectors 212 may provide electrical connections to devices and/or circuits in substrate 210.

A dielectric material 214 may be formed overlying electrical connectors 212 and along sidewalls of electrical connectors 212. Dielectric material 214 may extend along a surface of substrate 210. Dielectric material 214 may electrically isolate an electrical connector 212 from an adjacent electrical connector 212. Any suitable dielectric material may be used. Dielectric material 214 be formed of a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like.

A bottom conductive layer 216 is formed over dielectric material 214. Bottom conductive layer 216 extends through dielectric material 214 to contact electrical connectors 212. In this manner, bottom conductive layer 216 may be electrically connected to an electrical circuit of substrate 210. Bottom conductive layer 216 may be formed of a metal, for example Al, AlCu, Ti, TiN, or the like. In other embodiments bottom conductive layer 216 may be formed of a metal oxide, for example ITO, ZnO, RuO, or the like. Bottom conductive layer 216 may be formed using a suitable deposition process, such as ALD, CVD, PVD or the like.

Multilayer structures 224, 226 and 228 are formed over the bottom conductive layer 216. In some embodiments, multilayer structures 224, 226 and 228 are formed using the processes described above in connection with FIGS. 1-20. Although the cross section depicted in FIG. 21 depicts multilayer structures 224, 226 and 228 as being disconnected from each other, in plan view two or more of the multilayer structures 224, 226 and 228 may be continuous. Further, although three layers are depicted in each of multilayer structures 224, 226 and 228, in some embodiments one or more of multilayer structures 224, 226 and 228 may be formed of additional layers described above in connection with FIGS. 1-20.

In some devices, a first layer, an second layer, a third layer, and a fourth layer will be formed over the structure shown in FIG. 21 (see FIGS. 22-25 below). Each of the first layer, the second layer, the third layer, and the fourth layer will have portions that overlie the multilayer structures 224, 226 and 228, and portions that do not overlie the multilayer structures 224, 226 and 228. It may be desirable in some devices for the portions of one or more of these layers (for example the second layer and the first layer) that do not overlie the multilayer structures 224, 226 and 228 to be discontinuous from portions of the second layer and the first layer that overlie the multilayer structures 224, 226 and 228. It may desirable for these devices for other layers, for example the third layer and the fourth layer, to be continuous between the portions of the third layer and the fourth layer that overlie the multilayer structures 224, 226 and 228 and the portions of the third layer and the fourth layer that do not overlie the multilayer structures 224, 226 and 228. In some embodiments, the multilayer structures 224, 226 and 228 may enable the formation of the first layer, the second layer, the third layer, and the fourth layer to have the desired continuous/discontinuous characteristics.

Figure 22:
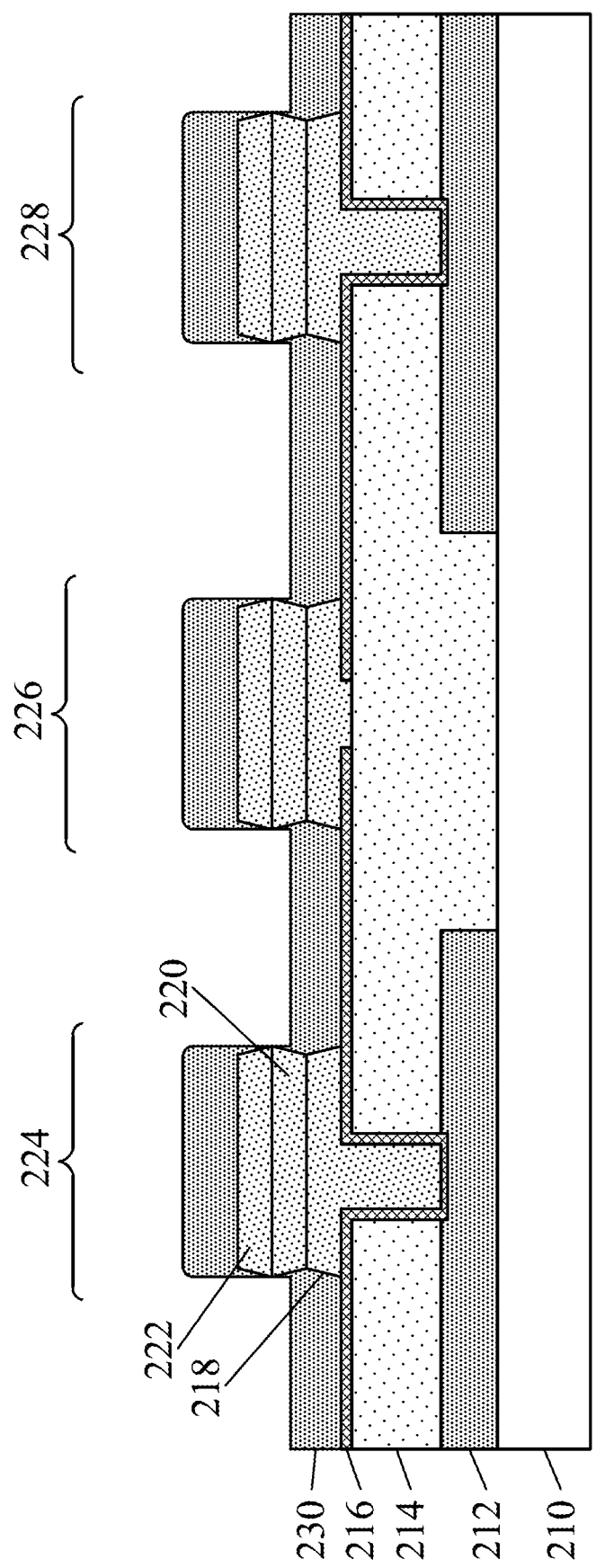

Referring to FIG. 22, a first layer 230 is formed over the bottom conductive layer 216, along sidewalls of multilayer structures 224, 226 and 228, and along top surfaces of multilayer structures 224, 226 and 228. The first layer 230 is a conductive layer in some embodiments. The first layer 230 may be formed of a metal, for example Al, AlCu, Ti, TiN, or the like. In other embodiments the first layer 230 may be formed of a metal oxide, for example ITO, ZnO, RuO, or the like. In some embodiments the first layer 230 is deposited, for example using chemical vapor deposition (CVD), atomic layer deposition (ALD), physical vapor deposition (PVD), plasma enhanced CVD (PECVD), or the like.

As shown in FIG. 22, the sidewall profiles of multilayer structures 224, 226 and 228 enable the first layer 230 to be formed in a manner that portions of first layer 230 that do not overlie any of the multilayer structures 224, 226 and 228 are discontinuous with portions of the first layer 230 that overlie one of the multilayer structures 224, 226 and 228. For example, top surfaces of the first layer 230 may intersect the second layers 220 of the multilayer structures 224, 226 and 228, and the re-entrant angles of the sidewalls of second layers 220 may help to cut the portions of first layer 230 that do not overlie any of the multilayer structures 224, 226 and 228 from portions of the first layer 230 that overlie one of the multilayer structures 224, 226 and 228.

Figure 23:
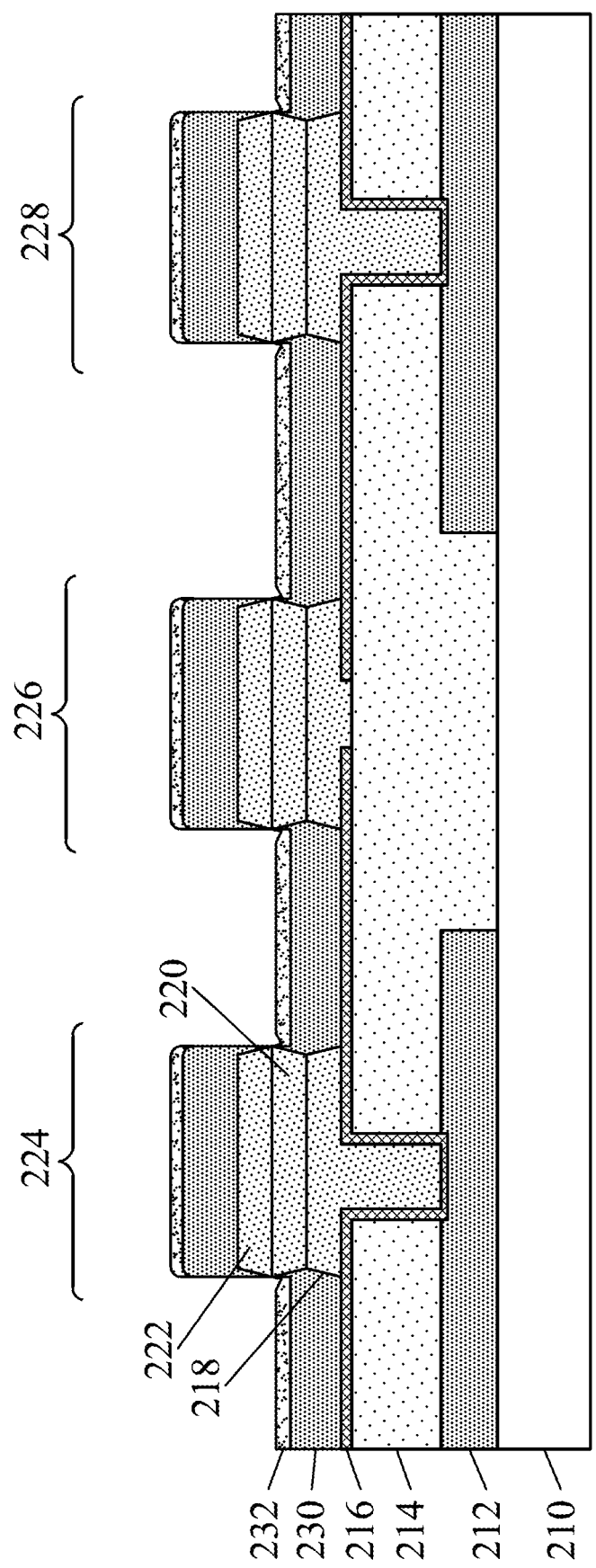

Referring to FIG. 23, a second layer 232 is formed over the first layer 230. Portions of the second layer 232 overlie multilayer structures 224, 226, and 228, and other portions of the second layer 232 do not overlie the multilayer structures 224, 226, and 228. In some embodiments the second layer 232 is deposited, for example using chemical vapor deposition (CVD), atomic layer deposition (ALD), physical vapor deposition (PVD), plasma enhanced CVD (PECVD), or the like. The second layer 232 is a conductive layer in some embodiments. The second layer 232 may be formed of a metal, for example Al, AlCu, Ti, TiN, or the like. In other embodiments the second layer 232 may be formed of a metal oxide, for example ITO, ZnO, RuO, or the like.

As shown in FIG. 23, the sidewall profiles of multilayer structures 224, 226 and 228 enable the second layer 232 to be formed in a manner that portions of the second layer 232 that do not overlie any of the multilayer structures 224, 226 and 228 are discontinuous with portions of the second layer 232 that overlie one of the multilayer structures 224, 226 and 228. For example, top surfaces of the second layer 232 may intersect the second layers 220 of the multilayer structures 224, 226 and 228, and the re-entrant angles of the sidewalls of second layers 220 may help to cut the portions of the second layer 232 that do not overlie any of the multilayer structures 224, 226 and 228 from portions of the second layer 232 that overlie one of the multilayer structures 224, 226 and 228.

Figure 24:
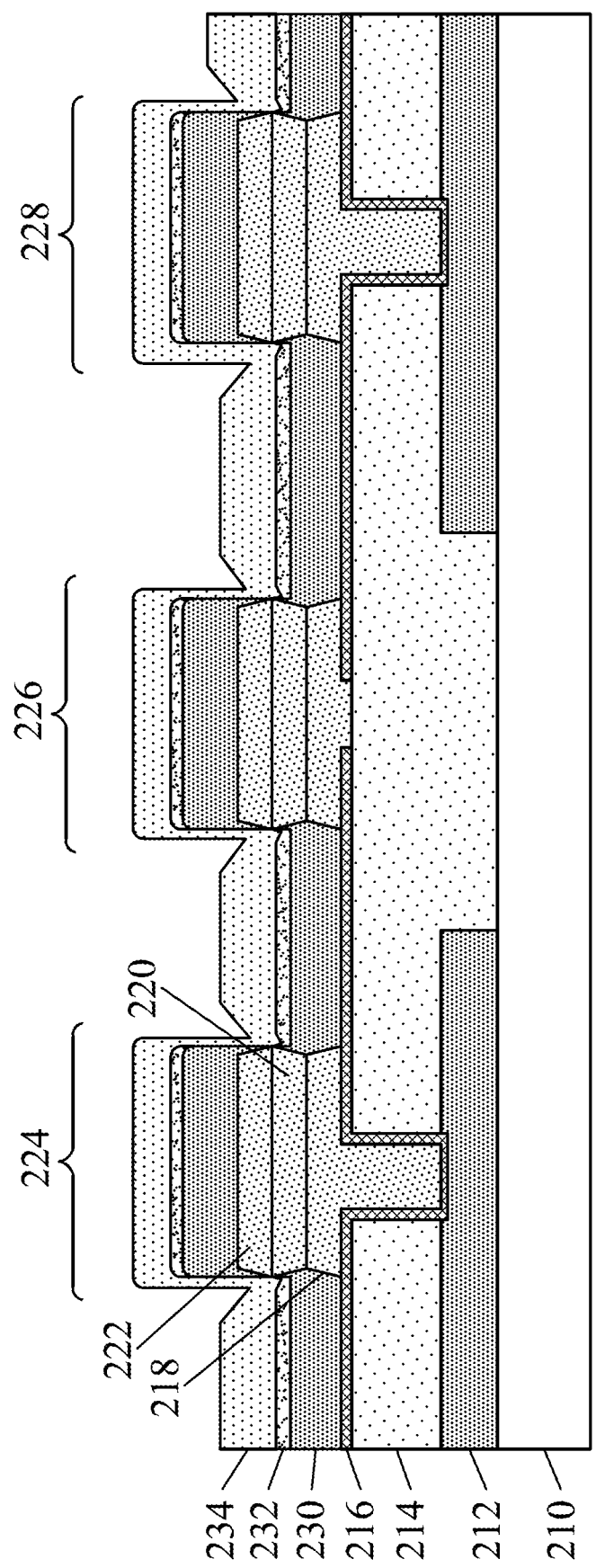

Referring to FIG. 24, a third layer 234 is formed over the second layer 232. Portions of the third layer 234 overlie multilayer structures 224, 226, and 228, and other portions of the third layer 234 do not overlie the multilayer structures 224, 226, and 228. In some embodiments the third layer 234 is deposited, for example using chemical vapor deposition (CVD), atomic layer deposition (ALD), physical vapor deposition (PVD), plasma enhanced CVD (PECVD), or the like. The third layer 234 is a conductive layer in some embodiments. The third layer 234 may be formed of a metal, for example Al, AlCu, Ti, TiN, or the like. In other embodiments the third layer 234 may be formed of a metal oxide, for example ITO, ZnO, RuO, or the like.

As shown in FIG. 24, the sidewall profiles of multilayer structures 224, 226 and 228 enable the third layer 234 to be formed in a manner that portions of the third layer 234 that do not overlie any of the multilayer structures 224, 226 and 228 are continuous with portions of the third layer 234 that overlie one of the multilayer structures 224, 226 and 228. For example, top surfaces of the third layer 234 may intersect the third layers 222 of the multilayer structures 224, 226 and 228, and the taper angles of the sidewalls of third layers 222 may help to enable the portions of the third layer 234 that do not overlie any of the multilayer structures 224, 226 and 228 to be continuous with portions of the third layer 234 that overlie one of the multilayer structures 224, 226 and 228.

Figure 25:
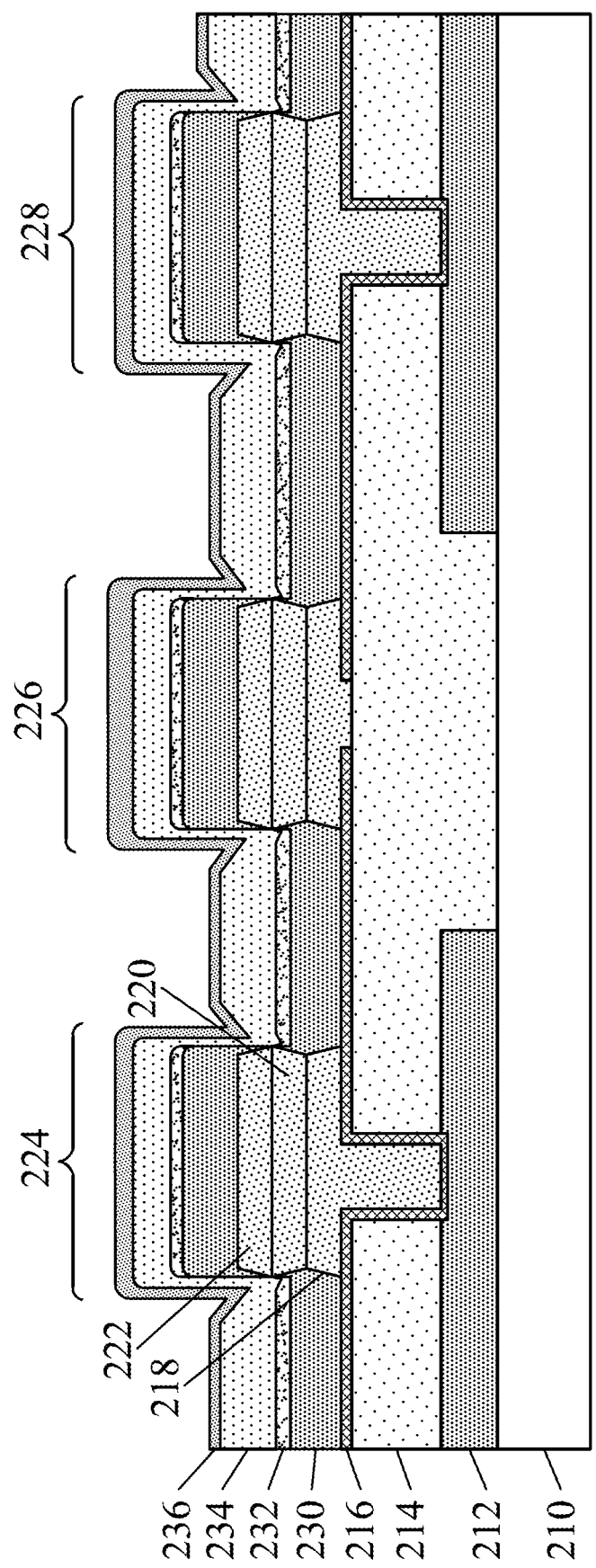

Referring to FIG. 25, a fourth layer 236 is formed over the third layer 234. Portions of the fourth layer 236 overlie multilayer structures 224, 226, and 228, and other portions of the fourth layer 236 do not overlie the multilayer structures 224, 226, and 228. In some embodiments the fourth layer 236 is deposited, for example using chemical vapor deposition (CVD), atomic layer deposition (ALD), physical vapor deposition (PVD), plasma enhanced CVD (PECVD), or the like. The fourth layer 236 is a conductive layer in some embodiments. The fourth layer 236 may be formed of a metal, for example Al, AlCu, Ti, TiN, or the like. In other embodiments the fourth layer 236 may be formed of a metal oxide, for example ITO, ZnO, RuO, or the like.

As shown in FIG. 25, the sidewall profiles of multilayer structures 224, 226 and 228 enable the fourth layer 236 to be formed in a manner that portions of the fourth layer 236 that do not overlie any of the multilayer structures 224, 226 and 228 are continuous with portions of the fourth layer 236 that overlie one of the multilayer structures 224, 226 and 228. For example, top surfaces of the fourth layer 236 may intersect the third layers 222 of the multilayer structures 224, 226 and 228, and the taper angles of the sidewalls of third layers 222 may help to enable the portions of the fourth layer 236 that do not overlie any of the multilayer structures 224, 226 and 228 to be continuous with portions of the fourth layer 236 that overlie one of the multilayer structures 224, 226 and 228.

As described herein, multi-layer structures, and methods of forming multi-layer structures, are provided in accordance with some embodiments. The multi-layer structures may include sidewalls having profiles that may be tailored to a particular design. For example, in a multi-layered structure, one layer of the multi-layered structure may have a sidewall that extends at a first angle, a second layer of the multi-layered structure may have a sidewall that extends at a second angle, and the first and second angle may be different from each other. The multi-layer structure may also include additional layers, and sidewalls of the additional layers may extend at angles that are the same as the first angle or the second angle, or different from the first angle or the second angle. In this manner, a desired sidewall profile of the multi-layer structure may be achieved.

In accordance with some embodiments, a desired sidewall profile of a multi-layer structure may be achieved with only one deposition/lithography/etching process, instead of using multiple deposition/lithography/etching processes. Accordingly, a multi-layer structure having a desired sidewall profile may be formed at a lower cost and with less time. Accordingly, manufacturing cycle times and/or outputs may be improved.

In accordance with some embodiments, a multi-layer structure having a sidewall profile as described herein may be utilized in the formation of integrated Si-nanosystem devices that contain sandwich architectures extending beside and overlying multi-layer structures. In some embodiments the multi-layer structures overlie a substrate, for example a silicon-complementary metal oxide semiconductor (CMOS) chip. Some Si-nanosystem devices may include a multi-layer structure over the CMOS chip. One or more layers may overlie the multi-layer structure, and these layers may extend laterally beyond the multi-layer structure over the CMOS chip. In some devices, it may be desirable to form a first layer of the one or more layers in a manner that a first portion of the first layer that does not overlie the multi-layer structure is discontinuous with a second portion of the first layer that overlies the multi-layer structure. Similarly, in some devices it may be desirable to form a second layer in a manner that a first portion of the second layer that contacts the first portion of the first layer is discontinuous from a second portion of the second layer that overlies the second portion of the first layer. Other layers may be desired to be continuous between portions of the layers that overlie the multi-layer structure and portions that do not overlie the multi-layer structure. The sidewall profile of the multi-layer structure may be designed in a matter that at least a portion of the sidewall helps to confine and/or cut off the first portion of the first layer from the second portion of the first layer, and/or the first portion of the second layer from the second portion of the second layer, while allowing other layers to be formed to be continuous.

A method is provided in accordance with some embodiments. The method includes depositing a plurality of layers on a substrate; patterning a first mask overlying the plurality of layers; performing a first etching process on the plurality of layers using the first mask as an etching mask, wherein after the first etching process the plurality of layers extend laterally beyond the first mask, and sidewalls of the plurality of layers are tapered; forming a polymer material along sidewalls of the first mask and sidewalls of the plurality of layers; removing the polymer material, wherein the removing of the polymer material consumes a portion of the first mask to form a remaining first mask; and performing a second etching process on the plurality of layers using the remaining first mask, wherein after the second etching process terminates a combined sidewall profile of the plurality of layers comprises a first portion and a second portion, and wherein a first angle of the first portion and a second angle of the second portion are different. In an embodiment removing of the polymer material causes sidewalls of the first mask to be tapered. In an embodiment the first angle is formed by the first portion with respect to a major surface of the substrate, and the second angle is formed by the second portion with respect to the major surface of the substrate, and the first angle is acute and wherein the second angle is obtuse. In an embodiment the plurality of layers includes a first layer, a second layer, and a third layer, the first portion comprises a sidewall of the first layer, the second portion comprises a sidewall of the second layer, and a third portion of the combined sidewall profile comprises a sidewall of the third layer, and the first angle, the second angle, and a third angle of the third portion are different. In an embodiment the first angle is in a range of 55-90 degrees. In an embodiment the second angle is in a range of 80-145 degrees. In an embodiment the third angle is in a range of 55-100 degrees. In an embodiment the method further includes forming a first layer, where a first portion of the first layer overlies the plurality of layers and a second portion of the first layer does not overlie the plurality of layers, and the first portion of the first layer is physically disconnected from the second portion of the first layer. In an embodiment the method further includes forming a second layer over the first layer, where a first portion of the second layer overlies the plurality of layers and a second portion of the second layer does not overlie the plurality of layers, and the first portion of the second layer is physically disconnected from the second portion of the second layer. In an embodiment the method further includes forming a third layer, where the third layer is continuous between a first portion of the third layer that overlies the plurality of layers and a second portion of the third layer that does not overlie the plurality of layers, and the method further includes forming a fourth layer, where the fourth layer is continuous between a first portion of the fourth layer that overlies the plurality of layers and a second portion of the fourth layer that does not overlie the plurality of layers.

A method is provided in accordance with some embodiments. The method includes forming a first plurality of layers on a substrate, where a material composition of a first layer of the first plurality of layers is different than a material composition of a second layer of the first plurality of layers; forming a photoresist material over the first plurality of layers; patterning the photoresist material to form a first mask and a second mask; performing a first etching process using the first mask and the second mask as etching masks, where the first etching process removes portions of the first plurality of layers that extend between the first mask and the second mask to form a second plurality of layers underlying the first mask and a third plurality of layers underlying the second mask; forming a polymer along sidewalls of the first mask and the second mask, wherein sidewalls of the polymer are tapered; removing the polymer using an ashing process, where the ashing process consumes a portion of the first mask and a portion of the second mask, to form a remaining first mask and a remaining second mask, where a shape of the remaining first mask is different than a shape of the first mask and a shape of the remaining second mask is different than a shape of the second mask; performing a second etching process on the second plurality of layers and the third plurality of layers using the remaining first mask and the remaining second mask as etching masks, where the second etching process terminates when a sidewall profile of the second plurality of layers is a target sidewall profile, and the target sidewall profile comprises different portions of the target sidewall profile extending at different angles; and removing the remaining first mask and the remaining second mask. In an embodiment sidewalls of the remaining first mask and the remaining second mask are tapered after the ashing process. In an embodiment the second etching process is performed using a first etchant and oxygen gas as etchants, and the first etchant comprises carbon and fluorine. In an embodiment the second plurality of layers comprises a first layer, a second layer, a third layer, and a fourth layer, where a first angle is formed by a sidewall of the first layer and a major surface of the substrate, a second angle is formed by a sidewall of the second layer and the major surface of the substrate, a third angle is formed by a sidewall of the third layer and the major surface of the substrate, a fourth angle is formed by a sidewall of the fourth layer and the major surface of the substrate, where the second angle and the third angle are the same, and wherein the first angle and the fourth angle are different than the second angle and the third angle. In an embodiment the method further includes forming a first layer, a second layer, a third layer, and a fourth layer along sidewalls of the second plurality of layers, where the target sidewall profile causes the first layer and the second layer to be discontinuous along the sidewalls of the first plurality of layers and the target sidewall profile causes the third layer and the fourth layer to be continuous along the sidewalls of the first plurality of layers. In an embodiment the first plurality of layers comprises at least six layers.

A device is provided in accordance with some embodiments. The device includes a substrate; a bottom conductive layer overlying the substrate; a multilayer structure over the bottom conductive layer, where a first portion of the bottom conductive layer is free of the multilayer structure and a second portion of the bottom conductive layer is covered by the multilayer structure; a first layer, where a first portion of the first layer overlies the first portion of the bottom conductive layer and a second portion of the first layer overlies the multilayer structure, and the first portion of the first layer is discontinuous with the second portion of the first layer, and wherein a portion of the multilayer structure extends between the first portion of the first layer and the second portion of the first layer; a second layer, where a first portion of the second layer overlies the first portion of the first layer and a second portion of the second layer overlies the multilayer structure, and the first portion of the second layer is discontinuous with the second portion of the second layer, and wherein the portion of the multilayer structure extends between the first portion of the second layer and the second portion of the second layer; a third layer, where a first portion of the third layer overlies the first portion of the second layer and a second portion of the third layer overlies the second portion of the second layer, and the first portion of the third layer is continuous with the second portion of the third layer; and a fourth layer overlying the third layer, where a first portion of the fourth layer overlies the first portion of the third layer and a second portion of the fourth layer overlies the second portion of the third layer, and the first portion of the fourth layer is continuous with the second portion of the fourth layer. In an embodiment the multilayer structure comprises a fifth layer, a sixth layer, and a seventh layer, and a portion of the sixth layer extends between the first portion of the first layer and the second portion of the first layer. In an embodiment the portion of the sixth layer extends between the first portion of the second layer and the second portion of the second layer. In an embodiment the first layer covers a sidewall of the fifth layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a plurality of layers on a substrate;
   patterning a first mask overlying the plurality of layers;
   performing a first etching process on the plurality of layers using the first mask as an etching mask, wherein after the first etching process the plurality of layers extend laterally beyond the first mask, and sidewalls of the plurality of layers are tapered;
   forming a polymer material along sidewalls of the first mask and sidewalls of the plurality of layers;
   removing the polymer material, wherein the removing of the polymer material consumes a portion of the first mask to form a remaining first mask; and
   performing a second etching process on the plurality of layers using the remaining first mask, wherein after the second etching process terminates a combined sidewall profile of the plurality of layers comprises a first portion and a second portion, and wherein a first angle of the first portion and a second angle of the second portion are different.

2. The method according to claim 1, wherein the removing of the polymer material causes sidewalls of the first mask to be tapered.

3. The method according to claim 1, wherein the first angle is formed by the first portion with respect to a major surface of the substrate, and the second angle is formed by the second portion with respect to the major surface of the substrate, wherein the first angle is acute and wherein the second angle is obtuse.

4. The method according to claim 1, wherein the plurality of layers includes a first layer, a second layer, and a third layer, wherein the first portion comprises a sidewall of the first layer, the second portion comprises a sidewall of the second layer, and a third portion of the combined sidewall profile comprises a sidewall of the third layer, and wherein the first angle, the second angle, and a third angle of the third portion are different.

5. The method according to claim 4, wherein the first angle is in a range of 55-90 degrees.

6. The method according to claim 5, wherein the second angle is in a range of 80-145 degrees.

7. The method according to claim 6, wherein the third angle is in a range of 55-100 degrees.

8. The method according to claim 1, further comprising:
   forming a first layer, wherein a first portion of the first layer overlies the plurality of layers and a second portion of the first layer does not overlie the plurality of layers, and the first portion of the first layer is physically disconnected from the second portion of the first layer.

9. The method according to claim 8, further comprising:
   forming a second layer over the first layer, wherein a first portion of the second layer overlies the plurality of layers and a second portion of the second layer does not overlie the plurality of layers, and the first portion of the second layer is physically disconnected from the second portion of the second layer.

10. The method according to claim 9, further comprising:
    forming a third layer, wherein the third layer is continuous between a first portion of the third layer that overlies the plurality of layers and a second portion of the third layer that does not overlie the plurality of layers; and
    forming a fourth layer, wherein the fourth layer is continuous between a first portion of the fourth layer that overlies the plurality of layers and a second portion of the fourth layer that does not overlie the plurality of layers.

11. A method, comprising:
    forming a first plurality of layers on a substrate, wherein a material composition of a first layer of the first plurality of layers is different than a material composition of a second layer of the first plurality of layers;
    forming a photoresist material over the first plurality of layers;
    patterning the photoresist material to form a first mask and a second mask;
    performing a first etching process using the first mask and the second mask as etching masks, wherein the first etching process removes portions of the first plurality of layers that extend between the first mask and the second mask to form a second plurality of layers underlying the first mask and a third plurality of layers underlying the second mask;
    forming a polymer along sidewalls of the first mask and the second mask, wherein sidewalls of the polymer are tapered;
    removing the polymer using an ashing process, wherein the ashing process consumes a portion of the first mask and a portion of the second mask, to form a remaining first mask and a remaining second mask, wherein a shape of the remaining first mask is different than a shape of the first mask and a shape of the remaining second mask is different than a shape of the second mask;
    performing a second etching process on the second plurality of layers and the third plurality of layers using the remaining first mask and the remaining second mask as etching masks, wherein the second etching process terminates when a sidewall profile of the second plurality of layers is a target sidewall profile, and the target sidewall profile comprises different portions of the target sidewall profile extending at different angles; and
    removing the remaining first mask and the remaining second mask.

12. The method according to claim 11, wherein sidewalls of the remaining first mask and the remaining second mask are tapered after the ashing process.

13. The method according to claim 11, wherein the second etching process is performed using a first etchant and oxygen gas as etchants, and the first etchant comprises carbon and fluorine.

14. The method according to claim 11, wherein the second plurality of layers comprises a first layer, a second layer, a third layer, and a fourth layer, wherein a first angle is formed by a sidewall of the first layer and a major surface of the substrate, a second angle is formed by a sidewall of the second layer and the major surface of the substrate, a third angle is formed by a sidewall of the third layer and the major surface of the substrate, a fourth angle is formed by a sidewall of the fourth layer and the major surface of the substrate, wherein the second angle and the third angle are the same, and wherein the first angle and the fourth angle are different than the second angle and the third angle.

15. The method according to claim 11, further comprising:
forming a first layer, a second layer, a third layer, and a fourth layer along sidewalls of the second plurality of layers, wherein the target sidewall profile causes the first layer and the second layer to be discontinuous along the sidewalls of the second plurality of layers and the target sidewall profile causes the third layer and the fourth layer to be continuous along the sidewalls of the second plurality of layers.

16. The method according to claim 11, wherein the first plurality of layers comprises at least six layers.

17. A device, comprising:
a substrate;
a bottom conductive layer overlying the substrate;
a multilayer structure over the bottom conductive layer, wherein a first portion of the bottom conductive layer is free of the multilayer structure and a second portion of the bottom conductive layer is covered by the multilayer structure;
a first layer, wherein a first portion of the first layer overlies the first portion of the bottom conductive layer and a second portion of the first layer overlies the multilayer structure, and the first portion of the first layer is discontinuous with the second portion of the first layer, and wherein a portion of the multilayer structure extends between the first portion of the first layer and the second portion of the first layer;
a second layer, wherein a first portion of the second layer overlies the first portion of the first layer and a second portion of the second layer overlies the multilayer structure, and the first portion of the second layer is discontinuous with the second portion of the second layer, and wherein the portion of the multilayer structure extends between the first portion of the second layer and the second portion of the second layer;
a third layer, wherein a first portion of the third layer overlies the first portion of the second layer and a second portion of the third layer overlies the second portion of the second layer, and the first portion of the third layer is continuous with the second portion of the third layer; and
a fourth layer overlying the third layer, wherein a first portion of the fourth layer overlies the first portion of the third layer and a second portion of the fourth layer overlies the second portion of the third layer, and the first portion of the fourth layer is continuous with the second portion of the fourth layer.

18. The device according to claim 17, wherein the multilayer structure comprises a fifth layer, a sixth layer, and a seventh layer, and wherein a portion of the sixth layer extends between the first portion of the first layer and the second portion of the first layer.

19. The device according to claim 18, wherein the portion of the sixth layer extends between the first portion of the second layer and the second portion of the second layer.

20. The device according to claim 19, wherein the first layer covers a sidewall of the fifth layer.

* * * * *